(12) United States Patent
Park et al.

(10) Patent No.: US 10,908,689 B2
(45) Date of Patent: Feb. 2, 2021

(54) METHOD FOR OUTPUTTING FEEDBACK BASED ON PIEZOELECTRIC ELEMENT AND ELECTRONIC DEVICE SUPPORTING THE SAME

(71) Applicant: Samsung Electronics Co., Ltd, Suwon-si (KR)

(72) Inventors: Je Heon Park, Hwaseong-si (KR); Jae Il Joo, Hwaseong-si (KR); Young Sup Shin, Suwon-si (KR); Ju Yeong Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/841,202

(22) Filed: Dec. 13, 2017

(65) Prior Publication Data

US 2018/0164890 A1 Jun. 14, 2018

(30) Foreign Application Priority Data

Dec. 14, 2016 (KR) .................... 10-2016-0170041

(51) Int. Cl.
*G08B 6/00* (2006.01)
*G06F 3/01* (2006.01)
(Continued)

(52) U.S. Cl.
CPC ............ *G06F 3/016* (2013.01); *G06F 3/0412* (2013.01); *G06F 3/0488* (2013.01); *G06F 3/16* (2013.01);
(Continued)

(58) Field of Classification Search
CPC ........ G06F 3/016; G06F 3/165; G06F 3/0488; G06F 3/01; G06F 3/038; G06F 3/041;
(Continued)

(56) References Cited

U.S. PATENT DOCUMENTS 8,248,218 B2 8/2012 Yamaya
8,294,557 B1 10/2012 El Saddik et al.
(Continued)

FOREIGN PATENT DOCUMENTS

EP 2098946 A1 9/2009
KR 20110024865 A 3/2011
(Continued)

OTHER PUBLICATIONS

Isakr, "International Search Report and Written Opinion of the International Searching Authority," International Application No. PCT/KR2017/014615, dated Mar. 13, 2018, 11 pages.
(Continued)

*Primary Examiner* — Anh V La

(57) ABSTRACT

An electronic device includes a display receiving a user input, at least one piezoelectric element disposed adjacent to the display and vibrating based on a specified control signal, a memory storing information about the user input, and a processor electrically connected to the display, the at least one piezoelectric element, and the memory. The processor applies a control signal corresponding to the user input to the at least one piezoelectric element based on the information about the user input and allows the at least one piezoelectric element vibrating depending on the control signal to output at least one of a specified vibration or a specified sound, in a display adjacent to the at least one piezoelectric element.

20 Claims, 14 Drawing Sheets

(51) Int. Cl.
    *H01L 41/04*     (2006.01)
    *G06F 3/041*     (2006.01)
    *G06F 3/16*     (2006.01)
    *G06F 3/0488*     (2013.01)
    *H01L 41/047*     (2006.01)

(52) U.S. Cl.
    CPC ............ *G06F 3/165* (2013.01); *H01L 41/042* (2013.01); *G06F 2203/04105* (2013.01); *H01L 41/0474* (2013.01)

(58) Field of Classification Search
    CPC ........ G06F 3/0354; G06F 3/0412; G06F 3/16; G06F 2203/041; G06F 2203/04105; H01L 41/04; H01L 41/042; H01L 41/0474
    USPC .................. 340/407.1, 407.2; 345/156, 173; 715/701, 702; 463/30
    See application file for complete search history.

(56) References Cited

U.S. PATENT DOCUMENTS

| | | | |
|---|---|---|---|
| 8,416,066 | B2 | 4/2013 | Westerinen et al. |
| 8,587,526 | B2 * | 11/2013 | Engelhardt ......... G06F 3/04883 |
| | | | 178/18.04 |
| 8,803,671 | B2 | 8/2014 | Westerinen et al. |
| 8,970,534 | B2 | 3/2015 | Adachi et al. |
| 9,117,994 | B2 | 8/2015 | Adachi et al. |
| 9,191,748 | B2 | 11/2015 | Nabata et al. |
| 9,510,105 | B2 | 11/2016 | Nabata et al. |
| 9,639,158 | B2 | 5/2017 | Levesque et al. |
| 2010/0090815 | A1 | 4/2010 | Yamaya |
| 2010/0156818 | A1 | 6/2010 | Burrough et al. |
| 2010/0207895 | A1 | 8/2010 | Joung et al. |
| 2011/0084911 | A1 * | 4/2011 | Simmons .............. G06F 3/0412 |
| | | | 345/173 |
| 2011/0248916 | A1 * | 10/2011 | Griffin ................... G06F 3/016 |
| | | | 345/157 |
| 2011/0267182 | A1 | 11/2011 | Westerinen et al. |
| 2012/0194460 | A1 | 8/2012 | Kuwabara et al. |
| 2012/0229407 | A1 | 9/2012 | Harris et al. |
| 2013/0147748 | A1 | 6/2013 | Westerinen et al. |
| 2013/0271412 | A1 | 10/2013 | Adachi et al. |
| 2013/0307803 | A1 | 11/2013 | Koga et al. |
| 2014/0028157 | A1 | 1/2014 | Adachi et al. |
| 2014/0198068 | A1 | 7/2014 | Lee et al. |
| 2014/0285453 | A1 | 9/2014 | Park et al. |
| 2014/0292668 | A1 | 10/2014 | Fricklas et al. |
| 2014/0354553 | A1 * | 12/2014 | Dai ....................... G06F 3/0416 |
| | | | 345/173 |
| 2014/0355792 | A1 | 12/2014 | Nabata et al. |
| 2015/0145657 | A1 | 5/2015 | Levesque et al. |
| 2015/0227207 | A1 | 8/2015 | Winter et al. |
| 2016/0044422 | A1 * | 2/2016 | Aurongzeb ......... G06F 3/03545 |
| | | | 345/179 |
| 2016/0073202 | A1 | 3/2016 | Nabata et al. |
| 2016/0139671 | A1 | 5/2016 | Jun et al. |
| 2016/0239088 | A1 * | 8/2016 | Conte .................... G06F 3/016 |
| 2017/0364190 | A1 * | 12/2017 | Rihn ...................... G06F 3/016 |

FOREIGN PATENT DOCUMENTS

| | | |
|---|---|---|
| KR | 101120928 B1 | 2/2012 |
| KR | 20120101359 A | 9/2012 |

OTHER PUBLICATIONS

Supplementary European Search Report dated Jan. 7, 2020 in connection with European Patent Application No. 17 88 0566, 14 pages.
Communication pursuant to Article 94(3) EPC dated Aug. 21, 2020 in connection with European Patent Application No. 17 880 566.9, 12 pages.

* cited by examiner

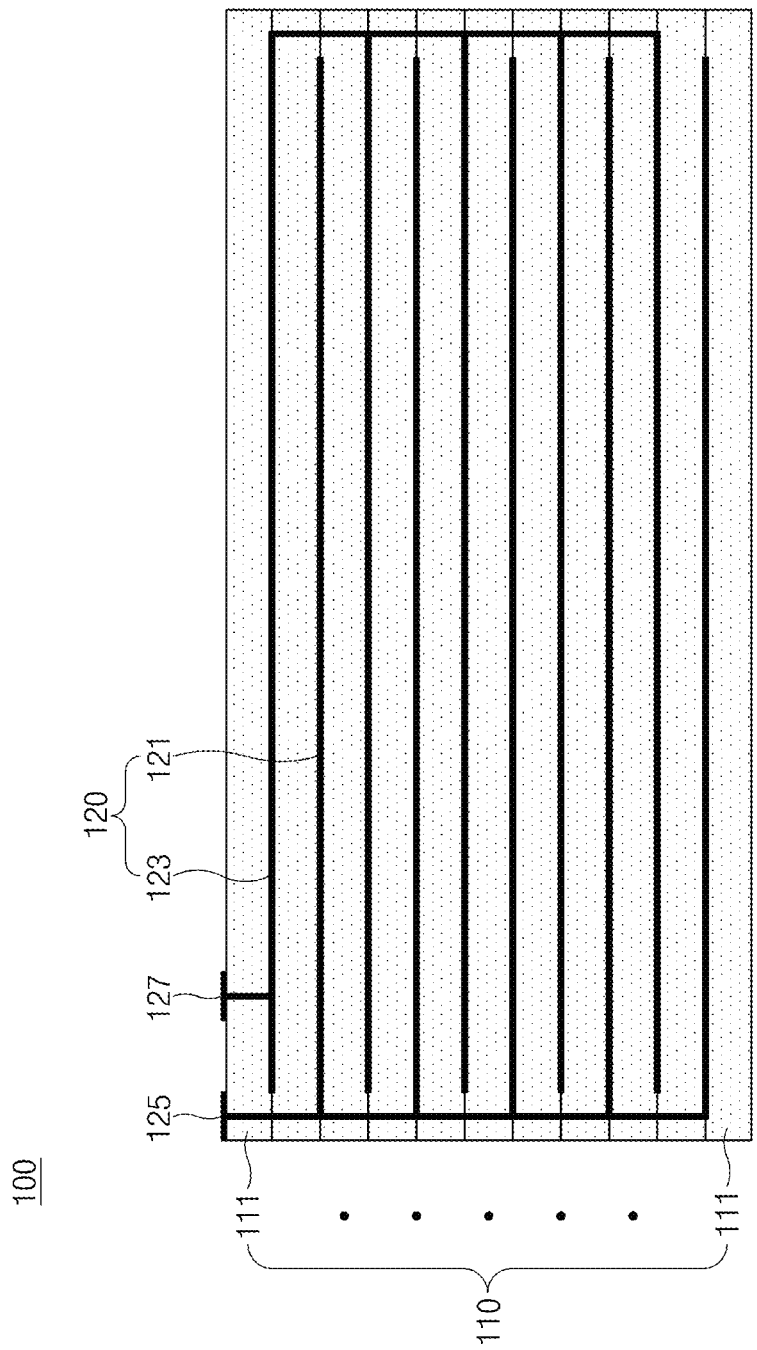

METHOD FOR OUTPUTTING FEEDBACK BASED ON PIEZOELECTRIC ELEMENT AND ELECTRONIC DEVICE SUPPORTING THE SAME

CROSS-REFERENCE TO RELATED APPLICATION(S)

The present application is related to and claims priority to Korean Patent Application No. 10-2016-0170041 filed Dec. 14, 2016, the entire disclosure of which is hereby incorporated by reference.

TECHNICAL FIELD

The present disclosure relates to feedback outputting control technology of an electronic device.

BACKGROUND

Recently proposed electronic devices are being developed to interact with a user and to provide the user with various experiences. For example, there is a so-called haptic technique that provides a physical tactile feedback on an electronic device in response to user manipulation (or a user input). To implement such a feedback system, a piezoelectric element capable of outputting vibration and/or sound may be incorporated in the electronic device.

SUMMARY

Certain technologies based on a piezoelectric element utilize the piezoelectric element as only a sound output means. For this reason, the utilization of the piezoelectric element may be limited, and the efficiency of the technologies may be also minimal. Accordingly, it is desirable that a feedback system be improved through the establishment of various operating platforms for the piezoelectric element.

To address the above-discussed deficiencies, it is a primary object to provide a feedback outputting method based on a piezoelectric element, which is capable of outputting vibration and sound based on at least one piezoelectric element when a user input to an electronic device is generated, and an electronic device supporting the same.

In addition, certain embodiments of the present disclosure to provide a feedback outputting method based on a piezoelectric element is capable of variably controlling the outputting of vibration or sound based on information about a user input, and an electronic device supporting the same.

According to some embodiments of the present disclosure, an electronic device may include a display receiving a user input, at least one piezoelectric element disposed adjacent to the display and vibrating based on a specified control signal, a memory storing information about the user input, and a processor electrically connected to the display, the at least one piezoelectric element, and the memory.

According to certain embodiments of the present disclosure, the processor may also apply a control signal corresponding to the user input to the at least one piezoelectric element based on the information about the user input and allow the at least one piezoelectric element vibrating depending on the control signal to output at least one of specified vibration or specified sound, in a display adjacent to the piezoelectric element.

Other aspects, advantages, and salient features of the disclosure will become apparent to those skilled in the art from the following detailed description, which, taken in conjunction with the annexed drawings, discloses various embodiments of the present disclosure.

According to various embodiments, feedback (e.g., vibration and/or sound) of various scenarios according to an operating environment of an electronic device may be provided based on at least one piezoelectric element mounted in an electronic device.

Besides, a variety of effects directly or indirectly understood through this disclosure may be provided.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 1 illustrates a piezoelectric element, according to certain embodiments of the present disclosure;

Throughout the drawings, it should be noted that like reference numbers are used to depict the same or similar elements, features, and structures.

DETAILED DESCRIPTION

Figure 2A:
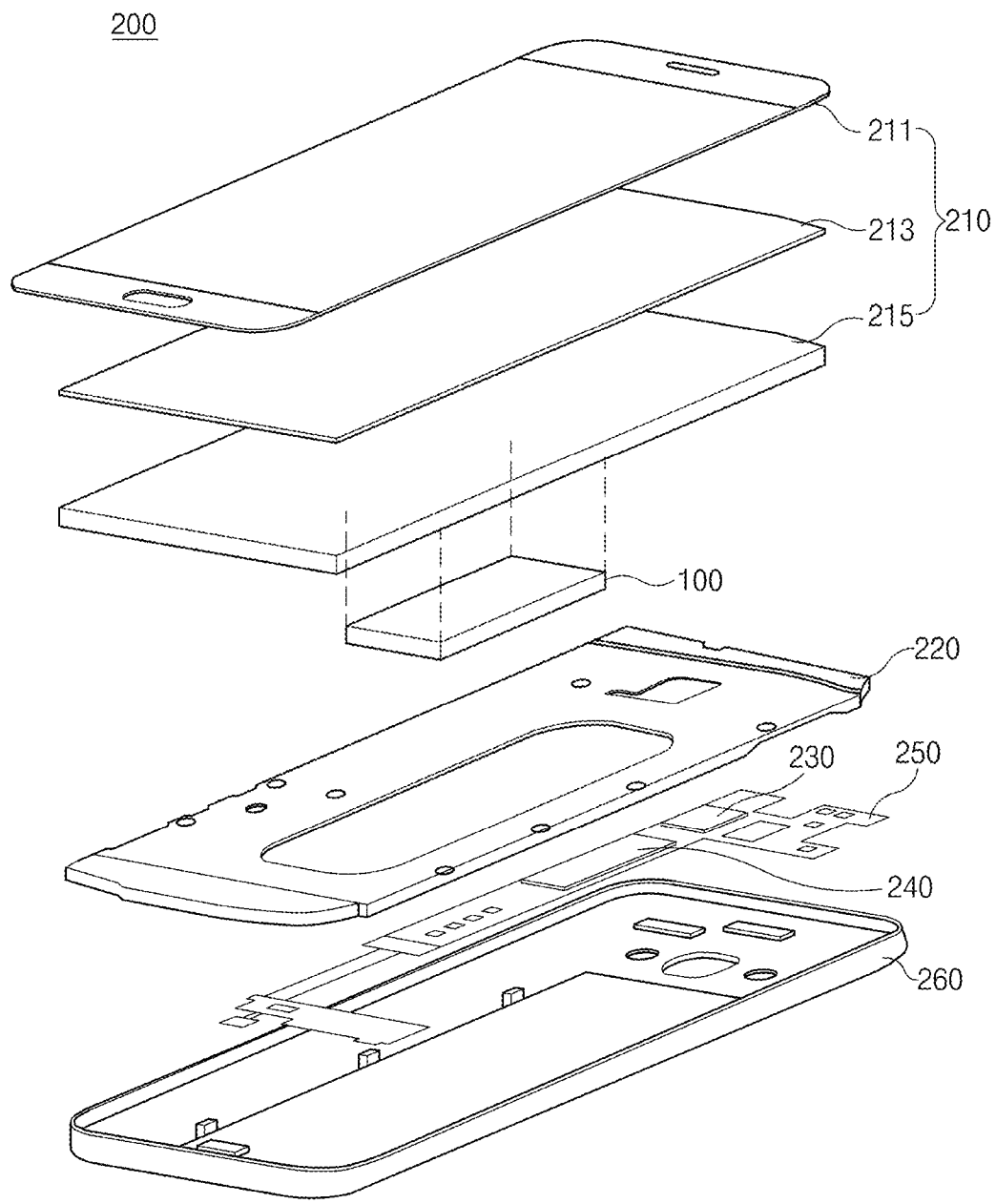
FIG. 2A illustrates a configuration of an electronic device, according to certain embodiments of the present disclosure.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to their dictionary definitions, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™) an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

FIG. 1 illustrates a view of a piezoelectric element, according to certain embodiments of this disclosure.

Referring to FIG. 1, a piezoelectric element 100 may include a piezoelectric body 110 in which a plurality of piezoelectric layers 111 are disposed, and an inner electrode 120 composed of anodes 121 and cathodes 123. The anode 121 or the cathode 123 may be alternately disposed between the piezoelectric layers 111; the piezoelectric element 100 may be formed by structuring the piezoelectric body 110 and the inner electrode 120 based on this placement pattern.

For example, each of the piezoelectric layers 111 may be formed by stacking a plurality of ceramic sheets. According to various embodiments, after slurry is obtained by mixing fine ceramic powder (e.g., crystal, zirconium titanate, platinum, barium titanate, or the like) with a binder or the like, the ceramic sheet may be formed by plasticizing and sintering the slurry at a specified temperature and time. Alternatively, the piezoelectric layer 111 may be formed based on a material obtained by compounding a high polymer material (e.g., polymer, rubber, or the like) with a ceramic material.

The inner electrode 120 may include a conductive metal material (e.g., Ag—Pd alloy, or the like). According to an embodiment, the inner electrode 120 may be printed on one area of the ceramic sheet constituting the piezoelectric layers 111, based on a screen printing scheme. Electrodes (e.g., the anodes 121 or the cathodes 123) having the same polarity in the piezoelectric element 100 may be connected to each other and may be connected to a positive terminal 125 or a negative terminal 127 formed to be exposed through one area of the piezoelectric element 100. The positive terminal 125 and the negative terminal 127 may be electrically connected to a specific element (e.g., a power supply device) of an electronic device to be described below and may receive power for an operation of the piezoelectric element 100.

According to an embodiment, in the case where power is applied to a piezoelectric body 110 (or a plurality of the piezoelectric layers 111) through the inner electrode 120, the piezoelectric element 100 may generate a physical displacement (e.g., vibration). For example, when electric dipoles inside the piezoelectric body 110 are changed by an electrical attractive force or an electrical repulsive force induced by the power, the piezoelectric element 100 may generate the physical displacement while being transformed structurally. Alternately, the piezoelectric element 100 may sense an external physical displacement (e.g., vibration). In this regard, the physical displacement generated from the outside (e.g., the physical displacement generated by another piezoelectric element) may apply pressure to the piezoelectric element 100, and the piezoelectric element 100 may sense the external physical displacement based on a voltage displacement generated depending on the applied pressure.

According to at least one embodiment, the piezoelectric element 100 may apply the generated physical displacement (e.g., vibration) to any material that is contacted with the piezoelectric element 100 or is adjacent to the piezoelectric element 100. In this case, the displacement corresponding to the physical displacement of the piezoelectric element 100 may be generated in the material, and a specified signal may be output based on the generated displacement. For example, the specified signal may be accompanied by the output of sound corresponding to the corresponding frequency band.

According to certain embodiments, the piezoelectric element 100 may be included as a part of an electronic device such as described below. For example, the piezoelectric element 100 may be disposed to be contacted with or adjacent to a specific element (e.g., a display panel) in an inner space of the electronic device. In the case where a user input is applied to the electronic device, the piezoelectric element 100 may receive a control signal from another element of the electronic device. The piezoelectric element 100 may generate the physical displacement (e.g., vibration) based on the control signal, and the generated physical displacement may be transmitted to an element that is in contact with the piezoelectric element 100 or is adjacent to the piezoelectric element 100. The displacement may be generated in the element that is contacted with the piezoelectric element 100 or is adjacent to the piezoelectric element 100 in response to the transmitted physical displacement, and the generated displacement may be caused by the output of a specified signal. According to some embodiments, the specified signal may be linked to the output of vibration and/or sound of the electronic device depending on the corresponding frequency band. Hereinafter, various embodiments in which feedback (e.g., vibration and/or sound) is provided in response to a user input based on a characteristic of the physical displacement of the piezoelectric element 100 and the function execution of elements of electronic device supporting the same will be described.

Figure 2B:
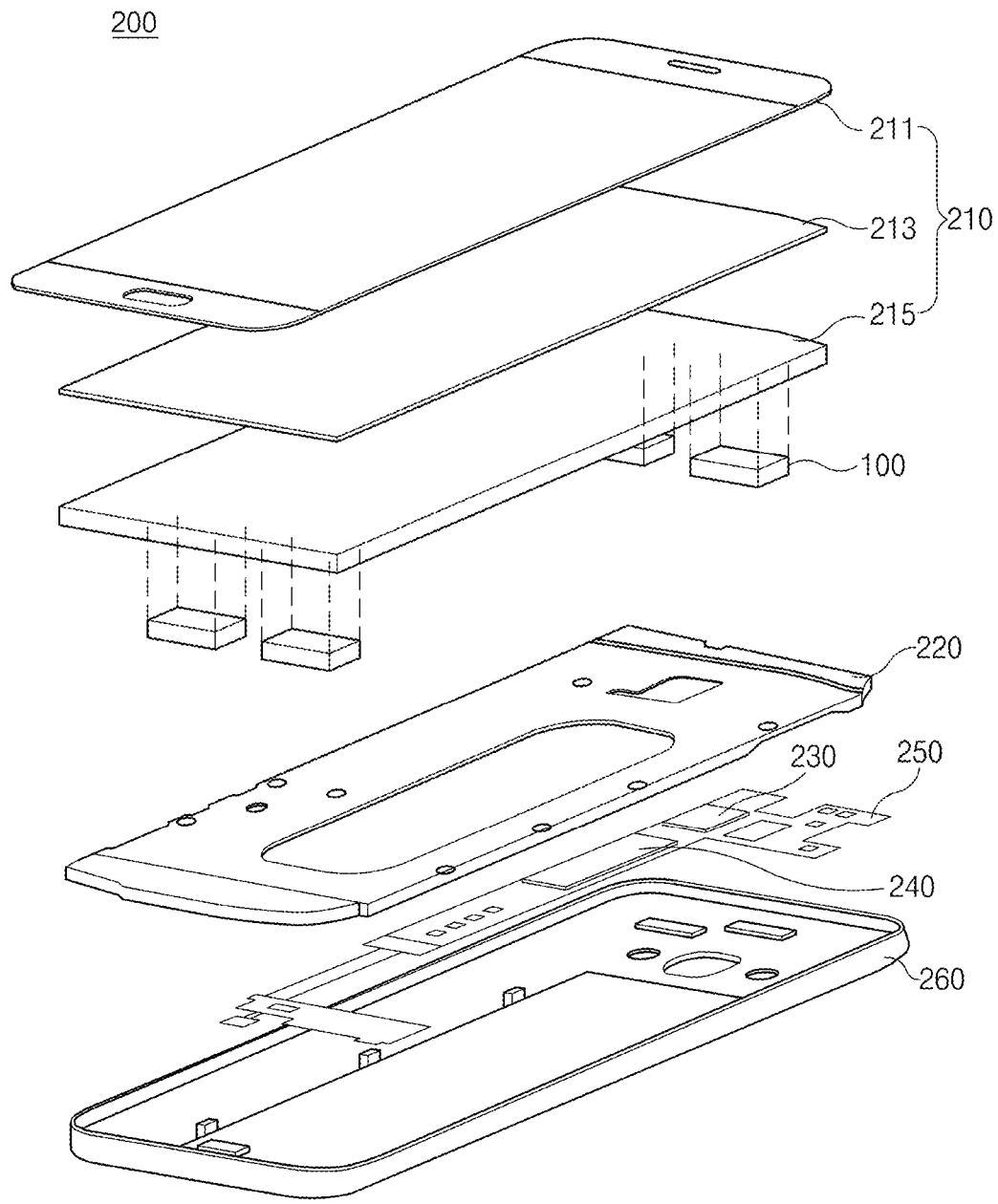
FIG. 2B illustrates a configuration of an electronic device, according to certain embodiments of the present disclosure.

FIGS. 2A and 2B illustrate configurations of an electronic device, according to various embodiments.

Referring to FIGS. 2A and 2B, an electronic device 200 may include a display 210, the at least one piezoelectric element 100, a support member 220, a memory 230, a processor 240, a printed circuit board 250, and a housing 260. According to various embodiments, the electronic device 200 may omit at least one of the above-described elements or may further include another element. For example, the electronic device 200 may further include a communication module performing wired or wireless communication with an external device (or a server), a power supply device (e.g., a battery or the like) supplying power to the elements of the electronic device 200, or the like. For example, the wireless communication may include at least one of long term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM), or the like as a cellular communication protocol. In addition, the wireless communication may include a short range communication such as Wireless Fidelity (Wi-Fi), Bluetooth®, Near Field Communication (NFC), magnetic stripe transmission (MST), or the like.

The housing 260 may form the outer appearance of the electronic device 200, and at the same time, may accommodate the above-described elements of the electronic device 200. The housing 260 may include a bottom surface, at least one side surface extending from a periphery of the bottom surface at a specific angle (e.g., substantially vertically), and a top surface facing the bottom surface. For example, an area of a specified size from the center may be opened on the top surface, and thus the housing 260 may include an inner space in which at least a partial area is opened.

The display 210 may output a screen (e.g., an application execution screen, a home screen, or the like) in response to user control or specified scheduling information. In this regard, the display 210 may receive a user input (e.g., touch, drag, or the like) from an electronic pen or a user's body (e.g., a finger) interacting with the electronic device 200. The display 210 may output a screen corresponding to the processing result for the user input by another element (e.g., the processor 240). For example, the screen may include at least one user interface, contents (e.g., a text, an image, a video, an icon, a widget, a symbol, or the like), or the like. According to an embodiment, with regard to the execution of the above-described function, the display 210 may include at least one of a cover glass 211, a user input sensing panel 213 or a display panel 215.

The cover glass 211 may be disposed above the display panel 215 and may pass light generated by the display panel 215. The user input using the above-described electronic pen or user's body may be applied to the cover glass 211. According to an embodiment, the cover glass 211 may be accommodated in the inner space of the housing 260, and may be disposed such that at least a partial area of the cover glass 211 is exposed to an open area of the top surface of the housing 260. At least a part of the area of the cover glass 211 inserted into the inner space may be coupled to or adhered to the housing 260 to close the housing 260.

The user input sensing panel 213 may detect a signal associated with a user input applied to the cover glass 211, may output the detected signal as an electrical signal, and may transmit the electrical signal to the processor 240. According to an embodiment, the user input sensing panel 213 may include at least one electrode layer and a control circuit. In this regard, the control circuit may sense a change in the physical quantity (e.g., voltage or capacitance) of the electrode layer due to a user input and may detect coordinates, a generation time, or duration of the user input. According to an embodiment, the user input sensing panel 213 may include a touch panel or a digitizer.

The display panel 215 may receive a signal according to the processing of the user input to output a screen corresponding to the user input. According to an embodiment, the display panel 215 may include the above-described user input sensing panel 213 as a part of the elements. According to various embodiments, the display panel 215 may include at least one of a liquid crystal display (LCD), a light-emitting diode (LED) display, an organic LED (OLED) display, a microelectromechanical systems (MEMS) display, or an electronic paper display.

The at least one piezoelectric element 100 may sense the pressure of a user input applied to at least a partial area of the cover glass 211 and may transmit information about the sensed pressure to the processor 240. According to an embodiment, the at least one piezoelectric element 100 may receive a specified control signal from the processor 240 in response to the generation of the user input and may generate a physical displacement (e.g., vibration) based on the control signal. The at least one piezoelectric element 100 may transmit the generated physical displacement to another element of the electronic device 200. For example, the at least one piezoelectric element 100 may be disposed to be adhered to the bottom surface of the display panel 215; and the at least one piezoelectric element 100 may transmit the generated physical displacement to the display panel 215. In this case, at least part of the display panel 215 may vibrate by the physical displacement received from the at least one piezoelectric element 100; for example, the vibration of the display panel 215 may be accompanied by the output of a signal in an audible frequency band or the output of a signal in a non-audible frequency band. According to various embodiments, at least one film (e.g., a black matrix film, an adhesive film, or the like) may be disposed between at least one piezoelectric element 100 and the display panel 215. The at least one film may operate as a medium that transmits the physical displacement of the piezoelectric element 100.

According to some embodiments, the at least one piezoelectric element 100 may be composed of a single piezoelectric element. Referring to FIG. 2A, the single piezoelectric element may be disposed in a specified area (e.g., a periphery of one side) on the bottom surface of the display panel 215 or in an arbitrary area in consideration of the structural relation with another element (e.g., the support member 220) (or not to overlap the structure of another element). The single piezoelectric element may sense the pressure of a user input applied to at least a partial area of the cover glass 211 and may be formed to be smaller in size than, for example, the display panel 215 in terms of the cost reduction or the weight saving of the electronic device 200.

Referring to FIG. 2B, according to certain embodiments, the at least one piezoelectric element 100 may be composed of a plurality of piezoelectric elements. The plurality of piezoelectric elements may be disposed such that at least a pair of piezoelectric elements is opposite to each other while being spaced apart from each other by a specified distance on the bottom surface of the display panel 215. The specified distance or the placement of a plurality of piezoelectric elements may be changed depending on a structural condition (e.g., the size of the cover glass 211 or the display panel 215, or the like) of the electronic device 200. According to at least one embodiment, in cases where the physical displacement (e.g., vibration) is generated by a first piezoelectric element corresponding to a part of the plurality of piezoelectric elements, the pressure according to the physical displacement of the first piezoelectric element may be applied to a second piezoelectric element corresponding to the remaining parts of the plurality of piezoelectric elements. As such, a voltage displacement may be generated in the second piezoelectric element by the applied pressure; and the physical displacement (e.g., vibration) of the first piezoelectric element may be sensed based on the generated voltage displacement.

The support member 220 (e.g., bracket) may be disposed on the bottom surface of the at least one piezoelectric element 100 and may support the at least one piezoelectric element 100 or the display 210. According to at least one embodiment, the support member 220 may be coupled to the at least one piezoelectric element 100 based on a separate coupling member (e.g., a screw or a band). In this case, the support member 220 may assist in providing firm contact between the at least one piezoelectric element 100 and the display 210.

The memory 230 may store at least one application program (e.g., Notepad, Paint, or the like) associated with the execution of the function of the electronic device 200 or a control program (e.g., a piezoelectric element driver, or the like) that controls the operation of the at least one piezoelectric element 100. In addition, the memory 230 may store a command or data, which is associated with an operation of another element of the electronic device 200 or an external device (e.g., an electronic pen, or the like) interacting with the electronic device 200. For example, the memory 230 may store information about the writing instrument object selected in response to user control, pressure information according to a user input, location information about the user input, or the like on the electronic device 200 and may establish the stored information as a database. For example, the writing instrument object may mean an input tool that allows the user input using an electronic pen or a user's body (e.g., a finger) to be output on the electronic device 200 (or the display 210) in various writing styles.

According to various embodiments, the memory 230 may include at least one of a volatile memory (e.g., a dynamic RAM (DRAM), a static RAM (SRAM), a synchronous dynamic RAM (SDRAM), or the like), a nonvolatile memory (e.g., an one time programmable ROM (OTPROM), a programmable ROM (PROM), an erasable and programmable ROM (EPROM), an electrically erasable and programmable ROM (EEPROM), or the like), a mask ROM, a flash ROM, or a flash memory.

The processor 240 may be electrically or operatively connected to other elements of the electronic device 200 and may perform control, a communication operation, data processing, or the like on the elements. For example, the processor 240 may apply a control signal (e.g., a pulse wave modulation PWM control signal, a square wave control signal, or a square wave alternating current (AC) signal) of a specified form to the at least one piezoelectric element 100 in response to the generation of the user input. For example, the control signal may be referred to as "power" supplied from a power supply device (e.g., a battery) of the electronic device 200. According to an embodiment, the processor 240 may change the frequency of the control signal based on information associated with the generated user input and may apply the control signal of the changed frequency to the at least one piezoelectric element 100. For example, the processor 240 may differently change the frequency of the control signal, depending on a type of a writing instrument object selected on the electronic device 200 by a user control. The processor 240 may differently control the physical displacement (e.g., vibration) to be generated by the at least one piezoelectric element 100 based on the change in the frequency of the control signal and the type of the writing instrument object selected from a user. According to various embodiments, the processor 240 may include, for example, at least one of a central processing unit (CPU), an application processor (AP), or a communication processor (CP).

As well as the above-described memory 230 or processor 240, various electronic components (e.g., a communication module, a camera module, a speaker module, and the like) associated with the functional operation of the electronic device 200, a circuit line, or the like may be mounted on the printed circuit board 250. According to an embodiment, at least part of the printed circuit board 250 may include a flexible material. According to various embodiments, the printed circuit board 250 may be composed of a plurality of printed circuit boards. At least part of the plurality of the printed circuit boards 250 may be stacked and may be electrically connected to each other.

Figure 3A:
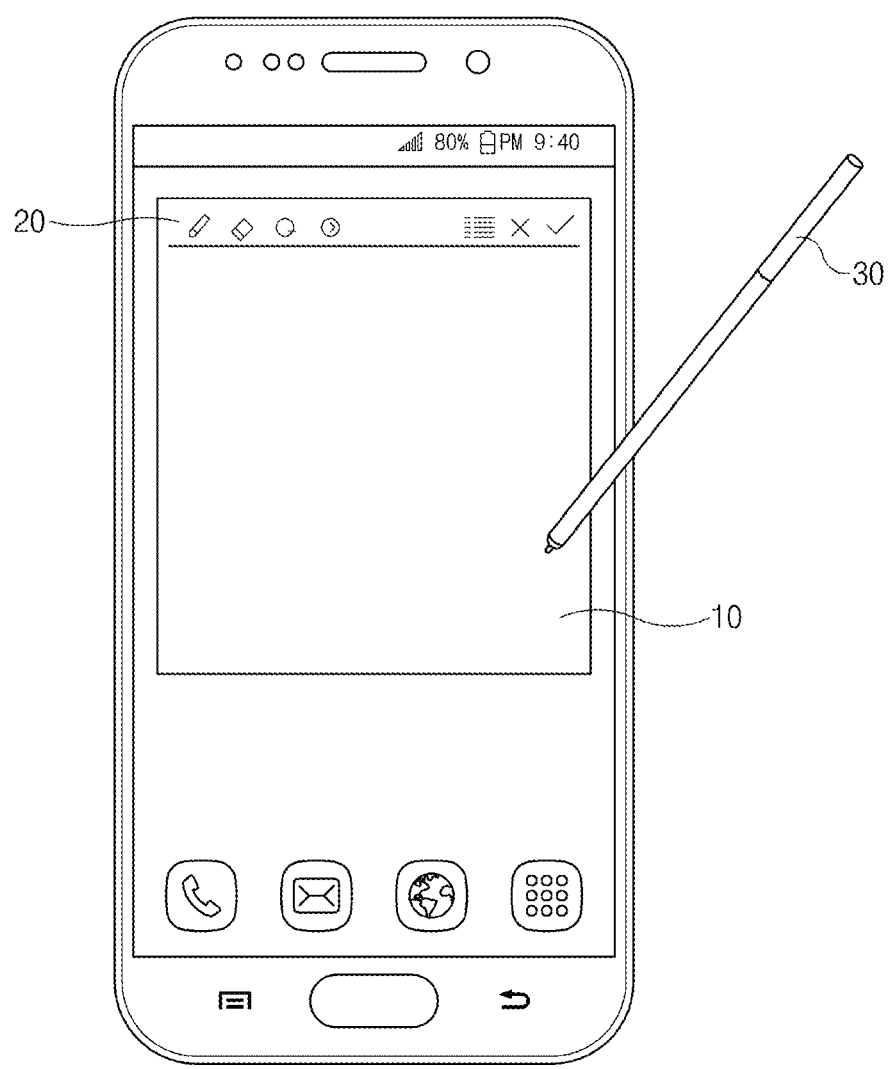
FIG. 3A illustrates an electronic device, according to certain embodiments of the present disclosure.
Figure 3B:
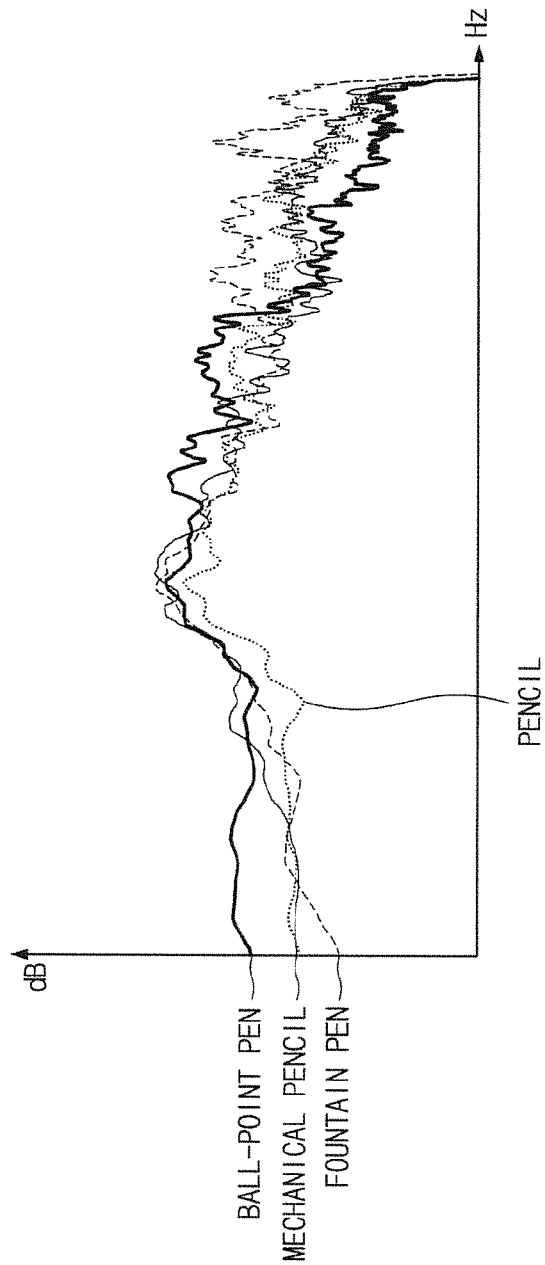
FIG. 3B illustrates a view of information associated with a user input, certain embodiments of the present disclosure.

FIG. 3A illustrates an electronic device, according to certain embodiments of the present disclosure. FIG. 3B illustrates information associated with a user input, according to certain embodiments.

Referring to FIG. 3A, according to some embodiments, a user may enter at least one of a letter, a number, a symbol, or an image on an execution screen 10 of an application program (e.g., Notepad, Paint, or the like) included in the electronic device 200, based on an electronic pen 30 (e.g., a touch pen or a digitizer pen). Alternatively, the user may perform an input by using a part of his/her body (e.g., a finger) without the electronic pen 30. In this operation, the user may manipulate a setting menu 20 included in the execution screen 10 of the application program to select a writing instrument object (e.g., a ball-point pen, a mechanical pencil, a pencil, a fountain pen, a brush, a pastel, or the like). For example, the writing instrument object selected by the user may allow a user input using the electronic pen 30 (or a body) to be output on the execution screen 10 of the application program in a writing style corresponding to the writing instrument object. According to various embodiments, in cases where the setting menu 20, such as a home screen of the electronic device 200, for selecting the writing instrument object is not supported, the user may select a writing instrument object through system settings of the electronic device 200.

According to at least one embodiment, in the case where the above-described writing instruments are actually used on a specified material (e.g., paper, glass, film, or the like), the processor 240 of FIG. 2A or 2B may store frequency information and sound information, which are generated with respect to each of the writing instruments, in the memory 230 of FIG. 2A or 2B. In this regard, referring to FIG. 3B, frequencies (Hz) or output sounds (dB), which are generated when each of the writing instruments (e.g., a ball-point pen, a mechanical pencil, a pencil, a fountain pen, and the like) are actually used, may be different between writing instruments. For example, the generated frequencies of a ball-point pen may include the characteristic of a first frequency (including a harmonic component), and the generated frequencies of a pencil may include the characteristic of a second frequency (including a harmonic component) of a band lower than the ball-point pen. As such, the writing instruments that have frequency characteristics different from each other may generate writing sounds different from each other based on the corresponding frequency characteristics, respectively. According to certain embodiments, as part of an operation of selecting a writing instrument object of the user through the setting menu 20 or the system setting of the electronic device 200, the processor 240 may output a user interface including information about a characteristic (e.g., frequency, writing sound, or the like) associated with each writing instrument object.

According to some embodiments of the present disclosure, in the case where a user input is generated with respect to the execution screen 10 of an application program or the home screen of the electronic device 200, the processor 240 may determine whether the user selects a writing instrument object, and may identify the selected writing instrument object by type. The processor 240 may allow the frequency of a control signal to be applied to at least one piezoelectric element 100 of FIG. 2A or 2B in response to the generation of a user input to correspond to or be similar to information (e.g., a frequency characteristic) of the identified writing instrument object. In this operation, the processor 240 may map the identified writing instrument object to the frequency of a control signal to be applied to the at least one piezoelectric element 100 and may store the mapped information in the memory 230 in the form of, for example, a table.

For example, the processor 240 may apply a control signal to the at least one piezoelectric element 100 through the execution screen 10 of an application program or the system setting of the electronic device 200 differently depending on the type of a writing instrument object selected from a user. As such, the at least one piezoelectric element 100 may generate a physical displacement (e.g., vibration) at a frequency corresponding to the selected writing instrument object and may transmit the generated physical displacement to the display panel 215 that is contacted with or adjacent to the at least one piezoelectric element 100. The displacement (e.g., vibration) may be generated in the display panel 215 by the received physical displacement. In the case where the frequency of a signal according to the displacement (e.g., vibration) corresponds to an audible frequency band, the display panel 215 may output the sound (e.g., a writing sound) corresponding to the selected writing instrument object. In the case where the frequency of the signal according to the displacement (e.g., vibration) corresponds to a non-audible frequency band, the display panel 215 may generate only the displacement (e.g., vibration) simply.

Figure 4A:
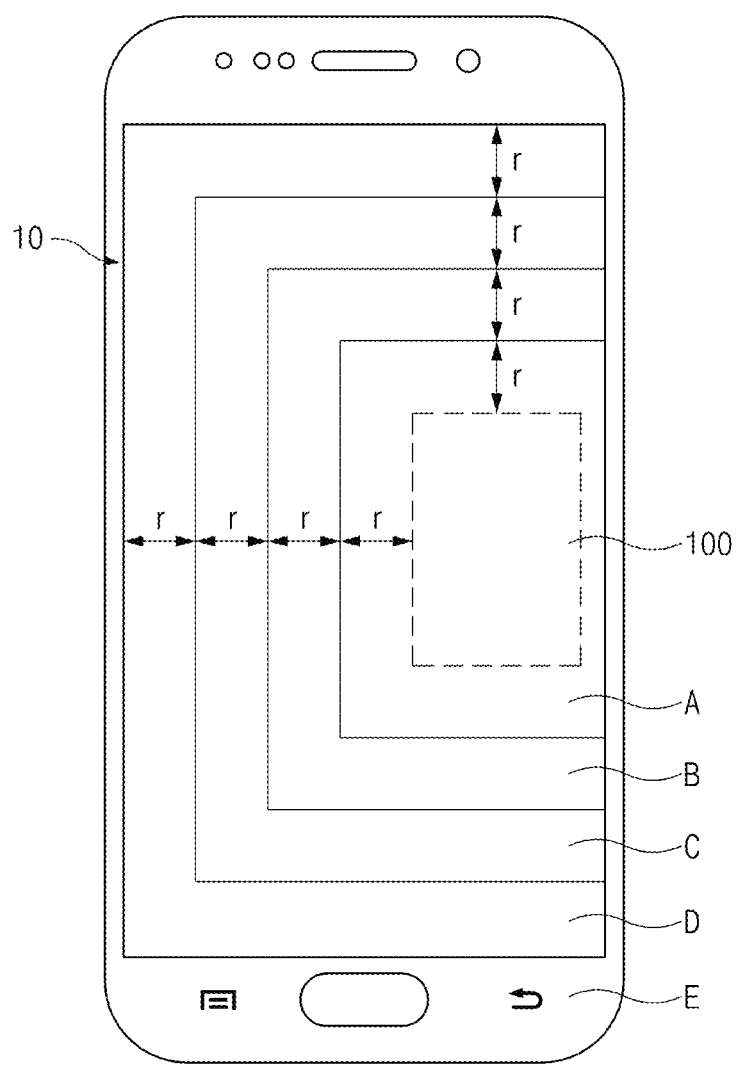
FIG. 4A illustrates a view of a virtual area form of an electronic device, according to certain embodiments of the present disclosure.
Figure 4B:
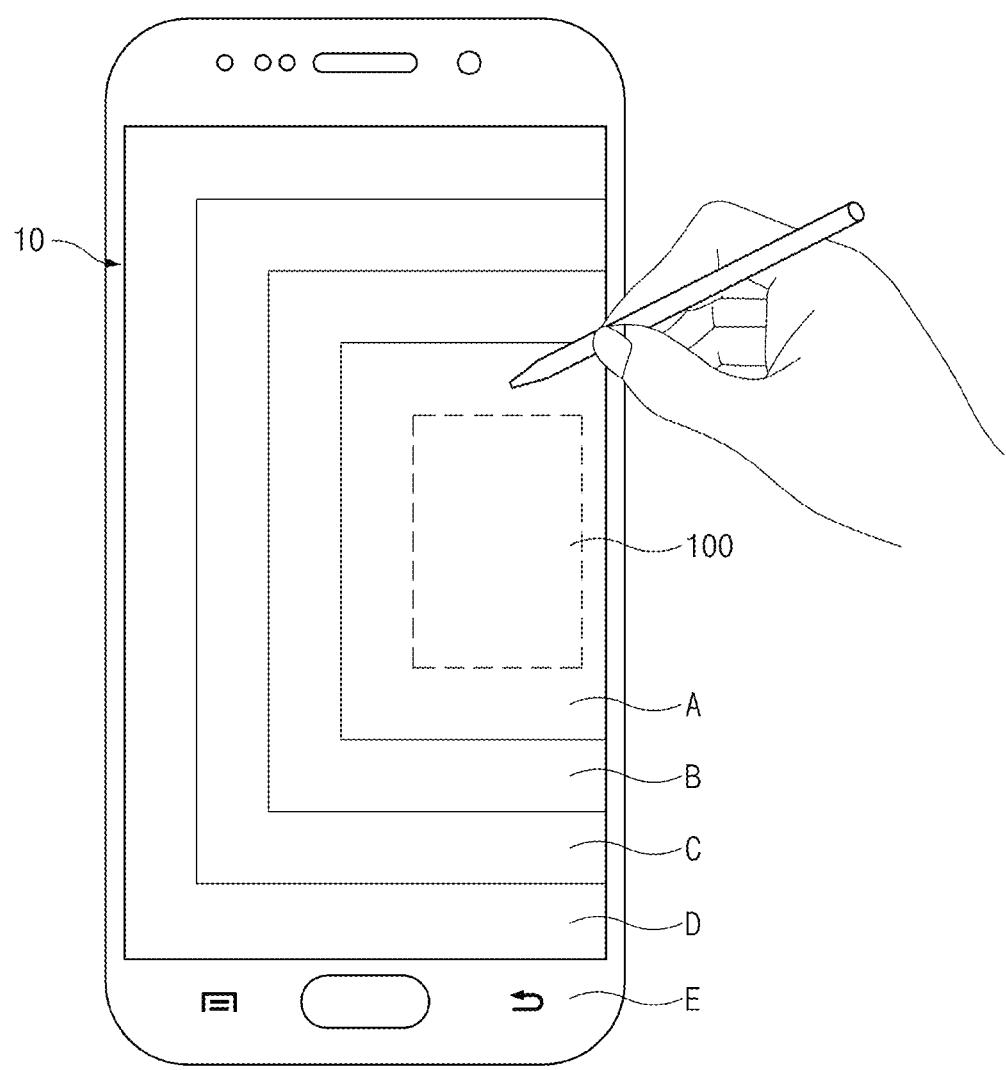
FIG. 4B illustrates a piezoelectric element of an electronic device operating according to certain embodiments of the present disclosure.

FIG. 4A illustrates a virtual area of an electronic device, according to certain embodiments of the present disclosure. FIG. 4B illustrates aspects of the operation of a piezoelectric element of an electronic device, according to an embodiment. In the nonlimiting examples of FIGS. 4A and 4B, an electronic device may include a single piezoelectric element.

According to at least one embodiment, in cases where a user input is applied to the electronic device 200, the processor 240 of FIG. 2A may apply a specific control signal (e.g., a PWM control signal, a square wave control signal, or a square wave AC signal) to the single piezoelectric element 100 of FIG. 2A based on a type of a writing instrument object selected by a user. In this operation, the processor 240 may further refer to information about a location at which the user input is generated, or information about pressure according to the user input.

In this regard, referring to FIGS. 4A and 4B, the processor 240 may divide a screen area of the display 210 of FIG. 2A into at least one or more virtual areas A to D. For example, the processor 240 may divide the at least one or more virtual areas A to D into ranges of a specified interval 'r' from a periphery of the single piezoelectric element 100. According to an embodiment, a bezel area of the electronic device 200 may be defined as a separate virtual area 'E' regardless of the interval 'r'.

According to some embodiments, the user input sensing panel 213 of FIG. 2A may detect coordinates at which the user input is generated, and may transmit the coordinates to the processor 240. The processor 240 may cause a control signal to be applied to the single piezoelectric element 100, based on information about the coordinates at which the user input is generated. For example, the user input may be generated in an area corresponding to an area in which the single piezoelectric element 100 is disposed, or may be generated in the bezel area 'E'. In this case, the processor 240 may apply a control signal (hereinafter referred to as a "first control signal") corresponding to a type of a writing instrument object selected on the electronic device 200 by the user, to the single piezoelectric element 100. Under condition that types of the writing instrument objects are the same as each other, in the case where the user input is generated within the first virtual area 'A' that is spaced apart from the single piezoelectric element 100, the processor 240 may increase the amplitude of the first control signal to a specified magnitude to apply the first control signal of the increased amplitude to the single piezoelectric element 100. Similarly or correspondingly, in the case where the user input is generated within the second virtual area B, the third virtual area C, or the fourth virtual area D, the processor 240 may gradually increase the amplitude of the first control signal depending on how the corresponding virtual area is spaced apart from the single piezoelectric element 100 and may apply the first control signal of the increased amplitude to the single piezoelectric element 100. As such, even though the user input is generated while being spaced from an area in which the single piezoelectric element 100 is disposed, the physical displacement generated by the single piezoelectric element 100 and the magnitude of a sound output due to the physical displacement may be maintained constantly or similarly.

According to other embodiments, the single piezoelectric element 100 may sense the pressure from a user input to transmit a pressure value to the processor 240. The processor 240 may compare the transmitted pressure value with a specified critical pressure value. The processor 240 may increase the amplitude of a control signal to be applied to the single piezoelectric element 100, to a specified magnitude with respect to the user input generated more than the critical pressure value. For example, in the case where the user input is generated in an arbitrary area (e.g., one area of the first to fourth virtual areas A to D) to be less than the critical pressure value, the processor 240 may apply a control signal (hereinafter referred to as a "second control signal") corresponding to a type of a writing instrument object selected on the electronic device 200 by the user, to the single piezoelectric element 100. Where processor 240 operates under the condition that types of the writing instrument objects are the same as each other, in the case where the user input is generated in the arbitrary area to be more than the critical pressure value, the processor 240 may increase the amplitude of the second control signal to a specified magnitude to apply the second control signal of the increased amplitude to the single piezoelectric element 100. Accordingly, the single piezoelectric element 100 may output the physical displacement (e.g., vibration) that is greater than the physical displacement of the user input less than the critical pressure value, and the sound due to the physical displacement, with respect to the user input that is generated more than the critical pressure value (or is applied).

Figure 5A:
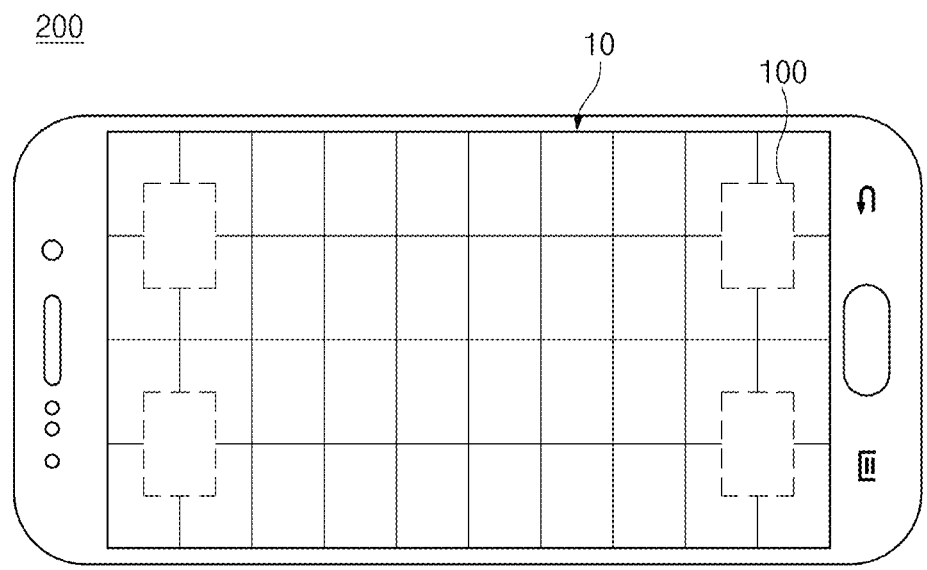
FIG. 5A illustrates a virtual area of an electronic device, according to certain embodiments of the present disclosure.
Figure 5B:
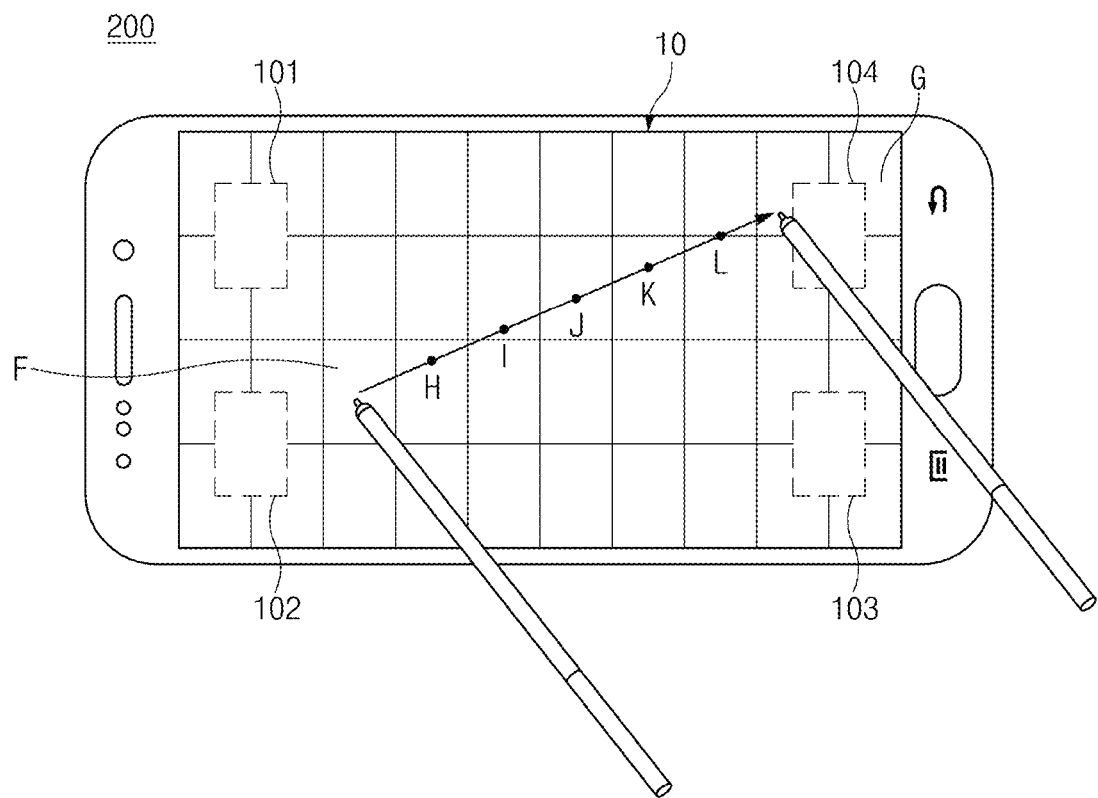
FIG. 5B illustrates a piezoelectric element of an electronic device operating according to certain embodiments of the present disclosure.

FIG. 5A illustrates a virtual area of an electronic device, according certain embodiments. FIG. 5B illustrates operation of a piezoelectric element operating of an electronic device, according to other embodiments. In FIGS. 5A and 5B, it is understood that an electronic device may include a plurality of piezoelectric elements.

Referring to FIGS. 5A and 5B, the processor 240 of FIG. 2B may divide the screen area of the display 210 of FIG. 2B into at least one or more virtual areas. For example, the processor 240 may divide the screen area of the display 210 into grid-type virtual areas of the approximately same size.

According to an embodiment, a user input using an electronic pen (e.g., a touch pen or a digitizer pen) or a user's body (e.g., a finger) may be applied to the execution screen of an application program (e.g., Notepad, Paint, or the like) or the home screen of the electronic device 200. The user input sensing panel 213 of FIG. 2B may detect a coordinate at which the user input is generated, and may transmit the coordinate to the processor 240. The processor 240 may determine the form of the user input based on information about the coordinate from the user input sensing panel 213. For example, in the case where coordinates are plural and the coordinates continue in an arbitrary direction, the processor 240 may determine that the user input is a drag input.

According to an embodiment, if it is determined that the user input is the drag input, the processor 240 may control signals to be applied to a plurality of piezoelectric elements 101, 102, 103, and/or 104 in response to a coordinate change according to the drag input, respectively. In this regard, for example, the drag input of the user may continue from a first virtual area 'F' to a second virtual area 'G' in the grid-type virtual areas. In this case, the processor 240 may divide a line generated by using a plurality of coordinates according to the drag input into specified intervals to designate at least one or more reference coordinates H to L. The processor 240 may calculate a distance between each of a plurality of piezoelectric elements 101, 102, 103, and/or 104 and each of the designated at least one or more reference coordinates H to L. In addition, the processor 240 may determine a direction in which the drag input continues. For example, the processor 240 may refer to a detection time of each of a plurality of coordinates included in information about a coordinate at which a user input from the user input sensing panel 213 is generated. The processor 240 may determine a direction in which the drag input continues, based on a start coordinate, at which the user input is detected first, from among the plurality of coordinates and an end coordinate, at which the user input is detected last, thereof. According to an embodiment, on the basis of information about the calculated distance and/or the direction of the user input, the processor 240 may identify a piezoelectric element, which is gradually spaced apart from the drag input of the user, from among the plurality of piezoelectric elements 101, 102, 103, and/or 104 or may identify a piezoelectric element, which is gradually adjacent to the drag input of the user, from among the plurality of piezoelectric elements 101, 102, 103, and/or 104. The processor 240 may apply a control signal (e.g., a control signal corresponding to a type of a writing instrument object selected by the user) to at least one piezoelectric element that is gradually spaced apart from the drag input of the user; as the spacing distance increases, the processor 240 may decrease the amplitude of the control signal in units of specified magnitudes to apply the control signal to the at least one piezoelectric element. Correspondingly, the processor 240 may apply the control signal to the at least one piezoelectric element that is gradually adjacent to the drag input; as a distance between the drag input and the piezoelectric element decreases, the processor 240 may increase the amplitude of the control signal in units of specified magnitudes to apply the control signal to the at least one piezoelectric element. Accordingly, the magnitude of the physical displacement (e.g., vibration) of the at least one piezoelectric element that is spaced apart from the drag input by the user may gradually attenuate in proportion to the distance; the magnitude of the physical displacement of the at least one piezoelectric element adjacent to the drag input by the user may gradually increase in proportion to the distance. As such, the electronic device 200 may constantly or similarly maintain the output magnitude of vibration or sound with respect to the drag input which continues in an arbitrary direction.

According to at least one embodiment, the processor 240 may change the amplitude of the control signal to a plurality of piezoelectric elements 101, 102, 103, and/or 104 based on the pressure according to the drag input. In this regard, the processor 240 may receive a pressure value according to the drag input from at least one of a plurality of piezoelectric elements 101, 102, 103, and/or 104. For example, the processor 240 may receive the pressure value according to the drag input from each of piezoelectric elements minimally adjacent to each of coordinates of a drag input continuing in an arbitrary direction. In the case where the received pressure value is not less than a specified critical pressure value, the processor 240 may increase the amplitude of the control signal to be applied to a piezoelectric element sensing the corresponding pressure value, to the specified magnitude.

According to various embodiments, an electronic device may include a display receiving a user input, at least one piezoelectric element disposed adjacent to the display and vibrating based on a specified control signal, a memory storing information about the user input, and a processor electrically connected to the display, the at least one piezoelectric element, and the memory.

According to various embodiments, the processor may apply a control signal corresponding to the user input to the at least one piezoelectric element based on the information about the user input and may allow the at least one piezoelectric element vibrating depending on the control signal to output at least one of a specified vibration or a specified sound, in a display adjacent to the at least one piezoelectric element.

According to various embodiments, the processor may be configured to identify a type of a writing instrument object selected by a user on the electronic device with regard to the user input, and to apply a control signal corresponding to the type of the writing instrument object to the at least one piezoelectric element.

According to various embodiments, the processor may be configured, if a pressure value associated with the user input is not less than a specified critical pressure value, to increase amplitude of the control signal to be applied to the at least one piezoelectric element.

According to various embodiments, the at least one piezoelectric element may include a single piezoelectric element.

According to various embodiments, the processor may be configured, as a coordinate value associated with the user input is spaced apart from the single piezoelectric element, to increase amplitude of the control signal to be applied to the single piezoelectric element.

According to various embodiments, the at least one piezoelectric element may include a plurality of piezoelectric elements.

According to various embodiments, the processor may be configured, if coordinate values associated with the user input are plural and the coordinate values continue from a first location to a second location on the electronic device, to gradually decrease amplitude of the control signal to be applied to at least one first piezoelectric element adjacent to the first location and to gradually increase the amplitude of the control signal to be applied to at least one second piezoelectric element adjacent to the second location.

According to various embodiments, the processor may allow a signal of an audible frequency band associated with the output of at least one of the specified sound or the specified vibration to be output in the display depending on vibration of the display according to vibration of the at least one piezoelectric element.

Figure 6:
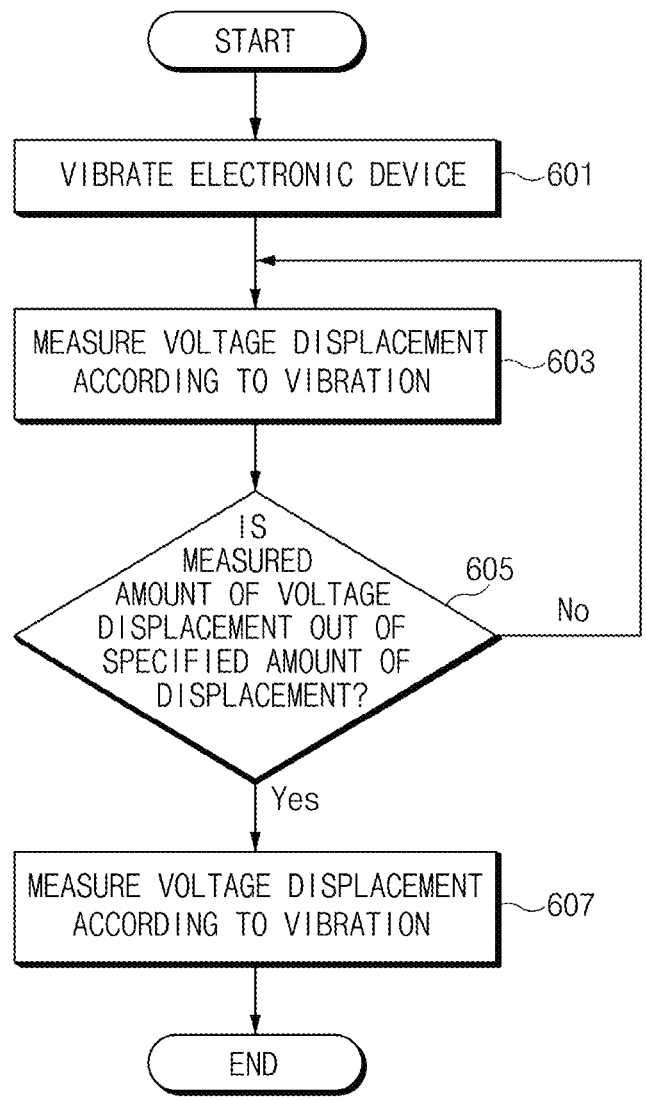
FIG. 6 illustrates a flowchart of a piezoelectric element operating method of an electronic device, according to certain embodiments of the present disclosure.

FIG. 6 illustrates a flowchart of a piezoelectric element operating method of an electronic device, according to certain embodiments of the present disclosure.

According to certain embodiments, a user of the above-described electronic device (e.g., the electronic device 200 of FIGS. 2A to 5B) may differently recognize the intensity of the vibration output by the electronic device, depending on an ambient environment of the electronic device (or an environment in which the electronic device is mounted). For example, in the case where the electronic device is located on or contacted with a physically rigid material (e.g., wood, glass, or the like), since the resonance occurs in the vibration output by the electronic device, the user may perceive a strong intensity of vibration. Alternatively, in the case where the electronic device is located on or contacted with a physically flexible material (e.g., fabric, leather, or the like), since the vibration is absorbed in the physically flexible material, the intensity of the vibration perceived by the user may be weak. According to an embodiment, the processor (e.g., the processor 240 of FIG. 2A or 2B) of the electronic device may apply different control signals to at least one or more piezoelectric elements (e.g., the piezoelectric element 100 of FIG. 2A or 2B) causing the generation of the vibration, depending on the ambient environment of the electronic device or the environment in which the electronic device is mounted.

Referring to FIG. 6, in operation 601, the electronic device may generate a physical displacement (e.g., vibration), based on a control signal (e.g., a PWM control signal, a square wave control signal, or a square wave AC signal) to be applied to at least one piezoelectric element by a processor.

In operation 603, at time when the number of occurrences of the physical displacement is not less than a specified frequency (e.g., more than once) or at time when a specified time (e.g., 0.7 to 1.0 second) elapses, a piezoelectric element (or a specific piezoelectric element (hereinafter referred to as a "first piezoelectric element") that is separately provided), which does not generate the physical displacement (e.g., vibration), from among the at least one or more piezoelectric elements may measure a voltage displacement generated depending on the physical displacement. For example, the first piezoelectric element may receive pressure depending on the physical displacement of another piezoelectric element and may measure a voltage displacement generated by the pressure.

In operation 605, the first piezoelectric element may determine whether or not the measured amount of voltage displacement belongs to a specified critical range. According to an embodiment, in the case where the measured amount of voltage displacement belongs to the critical range, the first piezoelectric element may repeatedly measure the voltage displacement according to the physical displacement of another piezoelectric element (or the vibration output of the electronic device).

Referring to operation 607, according to an embodiment, the amount of voltage displacement may be measured to be less than the minimum amount of voltage displacement within the critical range. In this case, the processor may increase the amplitude of the control signal to be applied to at least one piezoelectric element, in units of specified magnitudes. For example, the processor may increase the amplitude of the control signal in units of specified magnitudes at a specified cycle and may apply the control signal to at least one piezoelectric element. As such, the electronic device (e.g., an electronic device contacted with a flexible material) may gradually output the vibration of strong intensity.

According to some embodiments, the amount of voltage displacement may be measured to be greater than or equal to the maximum amount of displacement within the critical range. Accordingly, the processor may decrease the amplitude of the control signal in units of specified magnitudes at a specified cycle and may apply the control signal to at least one piezoelectric element. In such cases, the electronic device (e.g., an electronic device contacted with a rigid material) may gradually output the vibration of weak intensity.

According to various embodiments, an electronic device may include at least one first piezoelectric element vibrating based on a specified control signal, at least one second piezoelectric element generating a voltage displacement in response to the vibration of the first piezoelectric element, and a processor electrically connected to the at least one first piezoelectric element and the at least one second piezoelectric element.

According to various embodiments, in the case where the amount of voltage displacement of the at least one second piezoelectric element is less than the minimum amount of voltage displacement within a specified critical range, the processor may increase the amplitude of the control signal to be applied to the at least one first piezoelectric element, in units of specified magnitudes at a specified cycle.

According to various embodiments, in the case where the amount of voltage displacement of the at least one second piezoelectric element is not less than the maximum amount of voltage displacement within a specified critical range, the processor may decrease the amplitude of the control signal to be applied to the at least one first piezoelectric element, in units of specified magnitudes at a specified cycle.

According to various embodiments, a feedback outputting method of an electronic device may include vibrating, by at least one first piezoelectric element, based on a specified control signal, generating, by at least one second piezoelectric element, a voltage displacement in response to the vibration of the first piezoelectric element, and changing amplitude of a control signal to be applied to the at least one first piezoelectric element, based on the voltage displacement of the at least one second piezoelectric element.

According to various embodiments, in the case where the amount of voltage displacement of the at least one second piezoelectric element is less than the minimum amount of voltage displacement within a specified critical range, the changing of the amplitude of the control signal may include increasing the amplitude of the control signal to be applied to the at least one first piezoelectric element, in units of specified magnitudes at a specified cycle.

According to various embodiments, in the case where the amount of voltage displacement of the at least one second piezoelectric element is not less than the maximum amount of voltage displacement within a specified critical range, the changing of the amplitude of the control signal may include decreasing the amplitude of the control signal to be applied to the at least one first piezoelectric element, in units of specified magnitudes at a specified cycle.

Figure 7:
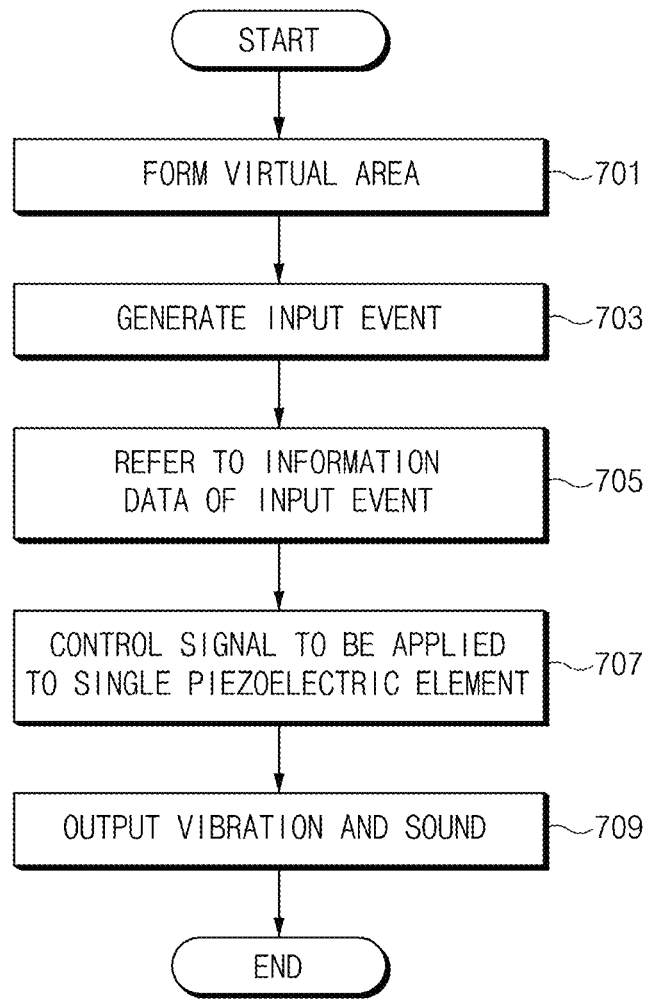
FIG. 7 illustrates a flowchart of a feedback outputting method of an electronic device, according to certain embodiments of the present disclosure.

FIG. 7 illustrates a flowchart of a feedback outputting method of an electronic device, according to certain embodiments of the present disclosure. In FIG. 7, it is understood that an electronic device may include a single piezoelectric element.

Referring to FIG. 7, in operation 701, a processor (e.g., the processor 240 of FIG. 2A) may divide a screen area of a display (e.g., the display 210 of FIG. 2A) of an electronic device (e.g., the electronic device 200 of FIG. 2A) into at least one or more virtual areas. For example, the processor may divide the at least one or more virtual areas into ranges of a specified interval from a periphery of the single piezoelectric element. According to some embodiments, the bezel area of the electronic device may be designated as a virtual area independently of the at least one or more virtual areas.

In operation 703, a user input using an electronic pen (e.g., a touch pen or a digitizer pen) or a user's body (e.g., a finger) may be applied to the execution screen of an application program (e.g., Notepad, Paint, or the like) mounted on or installed in the electronic device or the home screen of the electronic device. In operation 703, the user may select a writing instrument object that allows the user input to be output on the electronic device in various writing style, through a setting menu associated with the application program (e.g., a setting menu included in the execution screen of an application program) or system settings of the electronic device.

According to certain embodiments, in operation 705, the processor may determine whether the user selects the writing instrument object and may identify a type of the selected writing instrument object. According to at least one embodiment, in the case where at least one writing instrument object is actually used in a specified material (e.g., paper, glass, film, or the like), a memory (e.g., the memory 230 of FIG. 2A) of an electronic device may store frequency information and sound information, which are generated in each writing instrument object, in advance. In addition, the processor may obtain coordinates, at which the user input is generated, and information about pressure according to the user input, from the user input sensing panel (e.g., the user input sensing panel 213 of FIG. 2A) of the electronic device.

In operation 707, the processor may apply a control signal (e.g., a PWM control signal, a square wave control signal, or a square wave AC signal) corresponding to the identified writing instrument object to a single piezoelectric element. For example, the processor may allow the frequency of the control signal to correspond to or be similar to information (e.g., a frequency characteristic) of the identified writing instrument object, and may apply the control signal to the single piezoelectric element. In this operation, the processor may change the amplitude of the control signal based on information about coordinates at which the user input is generated. For example, in the case where the coordinate of the user input is detected in a first virtual area corresponding to a specified interval range from a periphery of the single piezoelectric element, the processor may increase the amplitude of the control signal to be applied to the single piezoelectric element, to a specified magnitude. Similarly, in the case where the coordinate of the user input is detected in a second virtual area corresponding to a specified interval range from a periphery of the single piezoelectric element, the processor may increase the amplitude of the control signal twice in units of specified magnitudes and may apply the control signal to the single piezoelectric element. Accordingly, the processor may gradually increase the amplitude of the control signal depending on how a virtual area in which the coordinate of the user input is detected is spaced apart from the single piezoelectric element and may apply the control signal to the single piezoelectric element. Alternatively, the processor may change the amplitude of the control signal based on pressure information according to the user input. For example, in the case where a pressure value associated with the user input is not less than a specified pressure value, the processor may increase the amplitude of the control signal to a specified magnitude and may apply the control signal to the single piezoelectric element.

In operation 709, the single piezoelectric element may generate a physical displacement (e.g., vibration) based on the control signal applied from the processor. In this operation, the physical displacement generated by the single piezoelectric element may be transmitted to a display (e.g., the display 210 or display panel 215 of FIG. 2A) which is in contact with or adjacent to the single piezoelectric element. In this case, the displacement (e.g., vibration) corresponding to the physical displacement from the single piezoelectric element may be generated in the display. According to at least one embodiment, in the case where the frequency of a signal according to the displacement generated in the display corresponds to an audible frequency band, the display may output a sound (e.g., a writing sound) corresponding to the identified writing instrument object.

Figure 8:
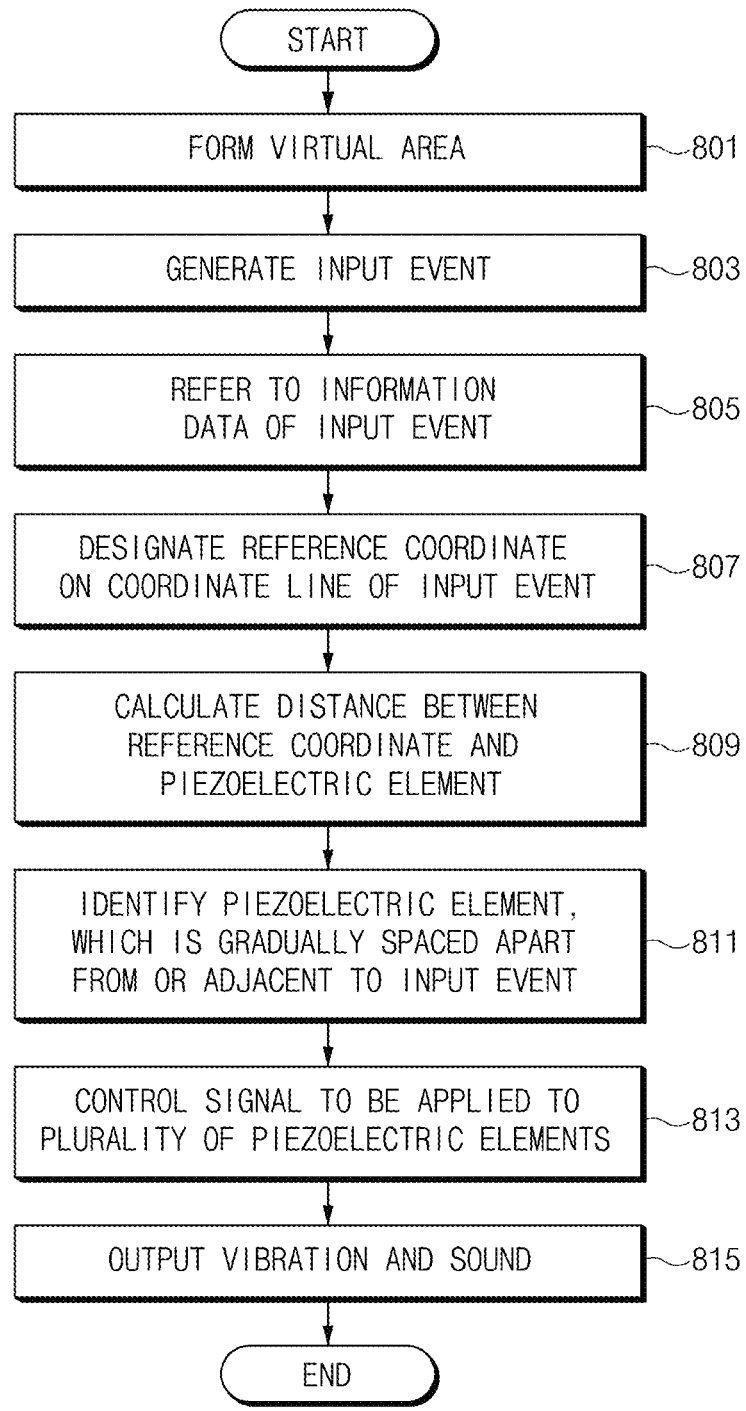
FIG. 8 illustrates a flowchart of a feedback outputting method of an electronic device, according to certain embodiments of the present disclosure.

FIG. 8 illustrates a flowchart of a feedback outputting method of an electronic device, according to certain embodiments. In FIG. 8, it is understood that an electronic device may include a plurality of piezoelectric elements.

According to some embodiments, in operation 801, the processor 240 of FIG. 2B may divide the screen area of the display 210 of FIG. 2B into at least one or more virtual areas.

For example, the processor may divide the screen area of the display into grid-type virtual areas of the same size.

In operation 803 and operation 805, the electronic device (e.g., the electronic device 200 of FIG. 2B) (or a user of the electronic device) may perform operations that are the same as or correspond to above-described operation 703 and operation 705 of FIG. 7. Accordingly, the duplicated descriptions will be skipped.

In operation 807, the processor may determine a form of the user input based on information about the coordinate, at which the user input from the user input sensing panel 213 of FIG. 2B is generated. In the case where coordinates at which the user input is generated are plural and the coordinates continue in an arbitrary direction, for example, the processor may determine that the user input is a drag input. The processor may divide a line generated by using the plurality of coordinates of the drag input into specified intervals and may designate at least one reference coordinate, in response to the generation of the drag input.

In operation 809, the processor may calculate a distance between each of the specified at least one or more reference coordinates and each of the plurality of piezoelectric elements 100 of FIG. 2B. In operation 811, the processor may determine a direction in which the drag input continues, based on a coordinate, at which the user input is detected first, from among the plurality of coordinates and a coordinate, at which the user input is detected last, thereof. On the basis of information about the calculated distance and the direction of the user input, the processor may identify a piezoelectric element, which is gradually spaced apart from or adjacent to the drag input, from among the plurality of piezoelectric elements.

In operation 813, the processor may apply a control signal (e.g., a control signal corresponding to a type of a writing instrument object selected by the user) to at least one piezoelectric element that is gradually spaced apart from the drag input of the user; as the spacing distance increases, the processor 240 may decrease the amplitude of the control signal in units of specified magnitudes to apply the control signal to the at least one piezoelectric element. Correspondingly, the processor may apply the control signal to the at least one piezoelectric element that is gradually adjacent to the drag input; as a distance between the drag input and the piezoelectric element decreases, the processor 240 may increase the amplitude of the control signal in units of specified magnitudes to apply the control signal to the at least one piezoelectric element.

In operation 815, the plurality of piezoelectric elements may generate a physical displacement (e.g., vibration) based on the control signal applied from the processor. In this operation, at least one piezoelectric element, which is gradually spaced apart from the drag input, from among the plurality of piezoelectric elements may output a gradually attenuating vibration in proportion of a spacing distance; at least one piezoelectric element, which is gradually adjacent to the drag input, from among the plurality of piezoelectric elements may output a gradually increasing vibration in proportion of a spacing distance. According to an embodiment, at least one of the plurality of piezoelectric elements may transmit a physical displacement (e.g., vibration) to a display (or a display panel) that is contacted with or adjacent to the at least one of the plurality of piezoelectric elements and may induce the displacement (e.g., vibration) of the display. The displacement (e.g., vibration) may be generated in the display in response to the physical displacement from at least one piezoelectric element. In the case where the frequency of a signal according to the displacement of the display corresponds to an audible frequency band, the display may output a sound (e.g., a writing sound) corresponding to a type of a writing instrument object selected from the user.

According to various embodiments, a feedback outputting method of an electronic device including at least one piezoelectric element may include receiving a user input, applying a specified control signal to the at least one piezoelectric element based on information about the user input, and outputting, by the at least one piezoelectric element vibrating based on the specified control signal, at least one of specified vibration or specified sound in a display adjacent to the at least one piezoelectric element.

According to certain embodiments according to the present disclosure, wherein receiving of the user input may include identifying a type of a writing instrument object selected from a user on the electronic device with regard to the user input.

According to various embodiments, wherein applying the specified control signal may include applying a control signal corresponding to the type of the writing instrument object to the at least one piezoelectric element.

According to various embodiments, wherein receiving the user input may include obtaining pressure information about the user input.

According to various embodiments, wherein applying the specified control signal may include, if a pressure value associated with the user input is not less than a specified critical pressure value, increasing amplitude of the specified control signal to be applied to the at least one piezoelectric element.

According to various embodiments, wherein receiving the user input may include obtaining coordinate information about the user input.

According to various embodiments, wherein applying the specified control signal may include, as a coordinate value associated with the user input is spaced apart from the at least one piezoelectric element, increasing amplitude of the specified control signal to be applied to the at least one piezoelectric element.

According to various embodiments, wherein applying the specified control signal may include, if coordinate values associated with the user input are plural and the coordinate values continue from a first location to a second location on the electronic device, gradually decreasing amplitude of the specified control signal to be applied to at least one first piezoelectric element adjacent to the first location.

According to various embodiments, wherein applying the specified control signal may include, if coordinate values associated with the user input are plural and the coordinate values continue from a first location to a second location on the electronic device, gradually increasing amplitude of the specified control signal to be applied to at least one second piezoelectric element adjacent to the second location.

Figure 9:
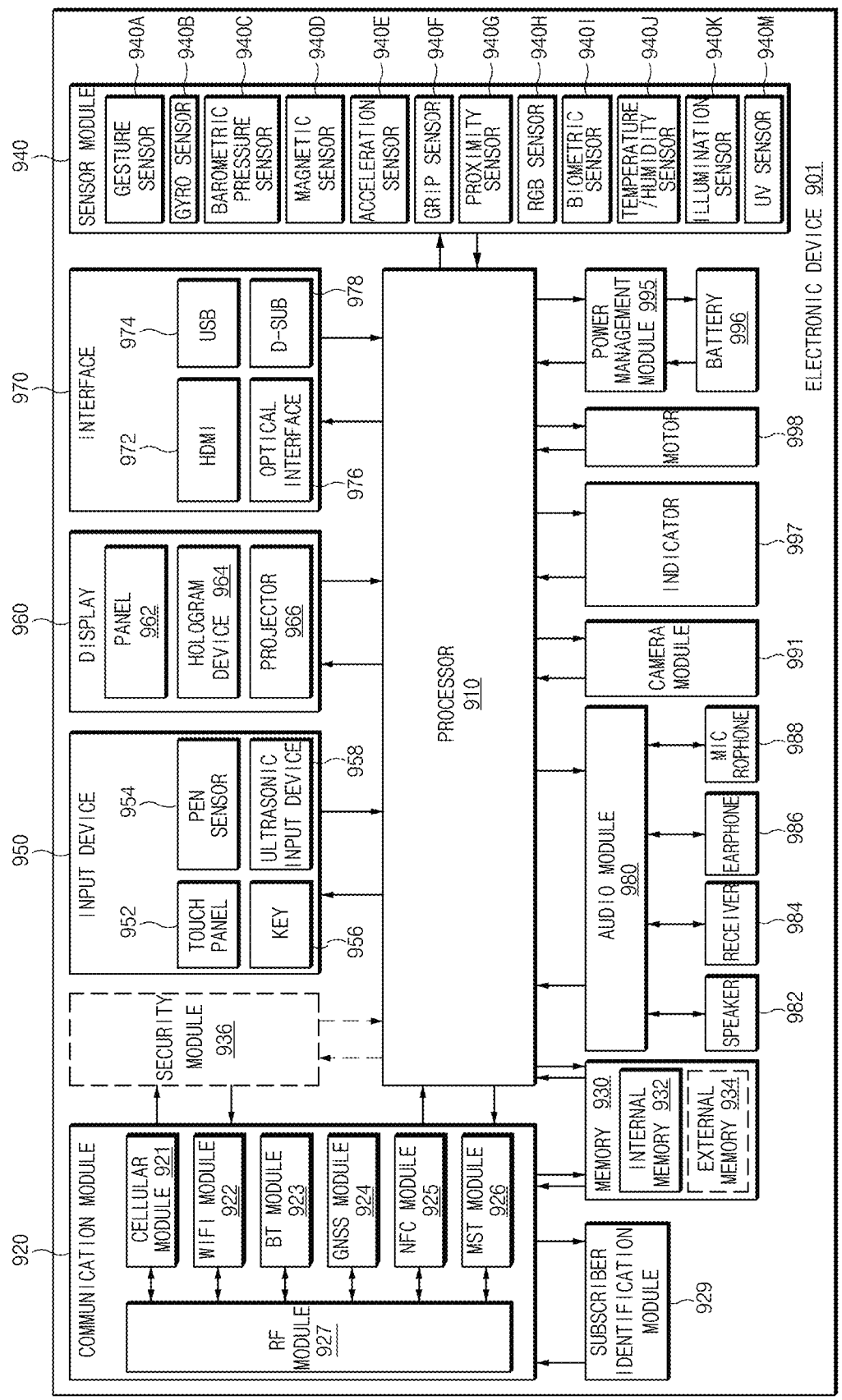
FIG. 9 illustrates a block diagram of an electronic device, according to certain embodiments of the present disclosure.

FIG. 9 illustrates a block diagram of an electronic device, according to certain embodiments of the present disclosure.

Referring to FIG. 9, the electronic device 901 may include one or more processors 910 (e.g., application processors (APs)), a communication module 920, a subscriber identification module (SIM) 929, a memory 930, a security module 936, a sensor module 940, an input device 950, a display 960, an interface 970, an audio module 980, a camera module 991, a power management module 995, a battery 996, an indicator 997, and a motor 998.

The processor 910 may drive, for example, an operating system (OS) or an application program to control a plurality of hardware or software components connected thereto and may process and compute a variety of data. The processor 910 may be implemented with, for example, a system on chip (SoC). According to at least one embodiment of the present disclosure, the processor 910 may include a graphic processing unit (GPU) (not shown) and/or an image signal processor (not shown). The processor 910 may include at least some (e.g., a cellular module 921) of the components shown in FIG. 9. The processor 910 may load a command or data received from at least one of other components (e.g., a non-volatile memory) into a volatile memory to process the data and may store various data in a non-volatile memory.

The communication module 920 may include, for example, the cellular module 921, a wireless-fidelity (Wi-Fi) module 922, a Bluetooth (BT) module 923, a global navigation satellite system (GNSS) module 924 (e.g., a GPS module, a Glonass module, a Beidou module, or a Galileo module), a near field communication (NFC) module 925, an MST module 926, and a radio frequency (RF) module 927.

The cellular module 921 may provide, for example, a voice call service, a video call service, a text message service, or an Internet service, and the like through a communication network. According to an embodiment of the present disclosure, the cellular module 921 may identify and authenticate the electronic device 901 in a communication network using the SIM 929 (e.g., a SIM card). According to an embodiment of the present disclosure, the cellular module 921 may perform at least part of functions which may be provided by the processor 910. According to an embodiment of the present disclosure, the cellular module 921 may include a communication processor (CP).

The Wi-Fi module 922, the BT module 923, the GNSS module 924, the NFC module 925, or the MST module 926 may include, for example, a processor for processing data transmitted and received through the corresponding module. According to various embodiments of the present disclosure, at least some (e.g., two or more) of the cellular module 921, the Wi-Fi module 922, the BT module 923, the GNSS module 924, the NFC module 925, or the MST module 926 may be included in one integrated chip (IC) or one IC package.

The RF module 927 may transmit and receive, for example, a communication signal (e.g., an RF signal). Though not shown, the RF module 927 may include, for example, a transceiver, a power amplifier module (PAM), a frequency filter, or a low noise amplifier (LNA), or an antenna, and the like. According to another embodiment of the present disclosure, at least one of the cellular module 921, the Wi-Fi module 922, the BT module 923, the GNSS module 924, the NFC module 925, or the MST module 926 may transmit and receive an RF signal through a separate RF module.

The SIM 929 may include, for example, a card which includes a SIM and/or an embedded SIM. The SIM 929 may include unique identification information (e.g., an integrated circuit card identifier (ICCID)) or subscriber information (e.g., an international mobile subscriber identity (IMSI)).

The memory 930 may include, for example, an embedded memory 932 or an external memory 934. The embedded memory 932 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OT-PROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 934 may include a flash drive, for example, a compact flash (CF), a secure digital (SD), a micro-SD, a mini-SD, an extreme digital (xD), a multimedia car (MMC), or a memory stick, and the like. The external memory 934 may operatively and/or physically connect with the electronic device 901 through various interfaces.

The security module 936 may be a module which has a relatively higher secure level than the memory 930 and may be a circuit which stores secure data and guarantees a protected execution environment. The security module 936 may be implemented with a separate circuit and may include a separate processor. The security module 936 may include, for example, an embedded secure element (eSE) which is present in a removable smart chip or a removable SD card or is embedded in a fixed chip of the electronic device 901. Also, the security module 936 may be driven by an OS different from the OS of the electronic device 901. For example, the security module 936 may operate based on a java card open platform (JCOP) OS.

The sensor module 940 may measure, for example, a physical quantity or may detect an operation state of the electronic device 901, and may convert the measured or detected information to an electric signal. The sensor module 940 may include at least one of, for example, a gesture sensor 940A, a gyro sensor 940B, a barometric pressure sensor 940C, a magnetic sensor 940D, an acceleration sensor 940E, a grip sensor 940F, a proximity sensor 940G, a color sensor 940H (e.g., red, green, blue (RGB) sensor), a biometric sensor 940I, a temperature/humidity sensor 940J, an illumination sensor 940K, or an ultraviolet (UV) sensor 940M. Additionally or alternatively, the sensor module 940 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 940 may further include a control circuit for controlling at least one or more sensors included therein. According to various embodiments of the present disclosure, the electronic device 901 may further include a processor configured to control the sensor module 940, as part of the processor 910 or to be independent of the processor 910. While the processor 910 is in a sleep state, the electronic device 901 may control the sensor module 940.

The input device 950 may include, for example, a touch panel 952, a (digital) pen sensor 954, a key 956, or an ultrasonic input device 958. The touch panel 952 may use at least one of, for example, a capacitive type, a resistive type, an infrared type, or an ultrasonic type. Also, the touch panel 952 may further include a control circuit. The touch panel 952 may further include a tactile layer and may provide a tactile reaction to a user.

The (digital) pen sensor 954 may be, for example, part of the touch panel 952 or may include a separate sheet for recognition. The key 956 may include, for example, a physical button, an optical key, or a keypad. The ultrasonic input device 958 may allow the electronic device 901 to detect a sound wave using a microphone (e.g., a microphone 988) and to verify data through an input tool generating an ultrasonic signal.

The display 960 may include a panel 962, a hologram device 964, or a projector 966. The panel 962 may be implemented to be, for example, flexible, transparent, or wearable. The panel 962 and the touch panel 952 may be integrated into one module. The hologram device 964 may show a stereoscopic image in a space using interference of light. The projector 966 may project light onto a screen to display an image. The screen may be positioned, for example, inside or outside the electronic device 901. According to an embodiment of the present disclosure, the display 960 may further include a control circuit for controlling the panel 962, the hologram device 964, or the projector 966.

The interface 970 may include, for example, a high-definition multimedia interface (HDMI) 972, a universal serial bus (USB) 974, an optical interface 976, or a D-sub-miniature 978. Additionally or alternatively, the interface 970 may include, for example, a mobile high definition link (MHL) interface, an SD card/multimedia card (MMC) interface, or an infrared data association (IrDA) standard interface.

The audio module 980 may convert a sound and an electric signal in dual directions. The audio module 980 may process sound information input or output through, for example, a speaker 982, a receiver 984, an earphone 986, or the microphone 988, and the like.

The camera module 991 may be a device which captures a still image and a moving image. According to an embodiment of the present disclosure, the camera module 991 may include one or more image sensors (not shown) (e.g., a front sensor or a rear sensor), a lens (not shown), an image signal processor (ISP) (not shown), or a flash (not shown) (e.g., an LED or a xenon lamp).

The power management module 995 may manage, for example, power of the electronic device 901. According to an embodiment of the present disclosure, though not shown, the power management module 995 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 996 and voltage, current, or temperature thereof while the battery 996 is charged. The battery 996 may include, for example, a rechargeable battery or a solar battery.

The indicator 997 may display a specific state of the electronic device 901 or part (e.g., the processor 910) thereof, for example, a booting state, a message state, or a charging state, and the like. The motor 998 may convert an electric signal into mechanical vibration and may generate vibration or a haptic effect, and the like. Though not shown, the electronic device 901 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a MediaFLO™ standard, and the like.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Also, some of the elements of the electronic device according to various embodiments of the present disclosure may be combined with each other to form one entity, thereby making it possible to perform the functions of the corresponding elements in the same manner as before the combination.

Figure 10:
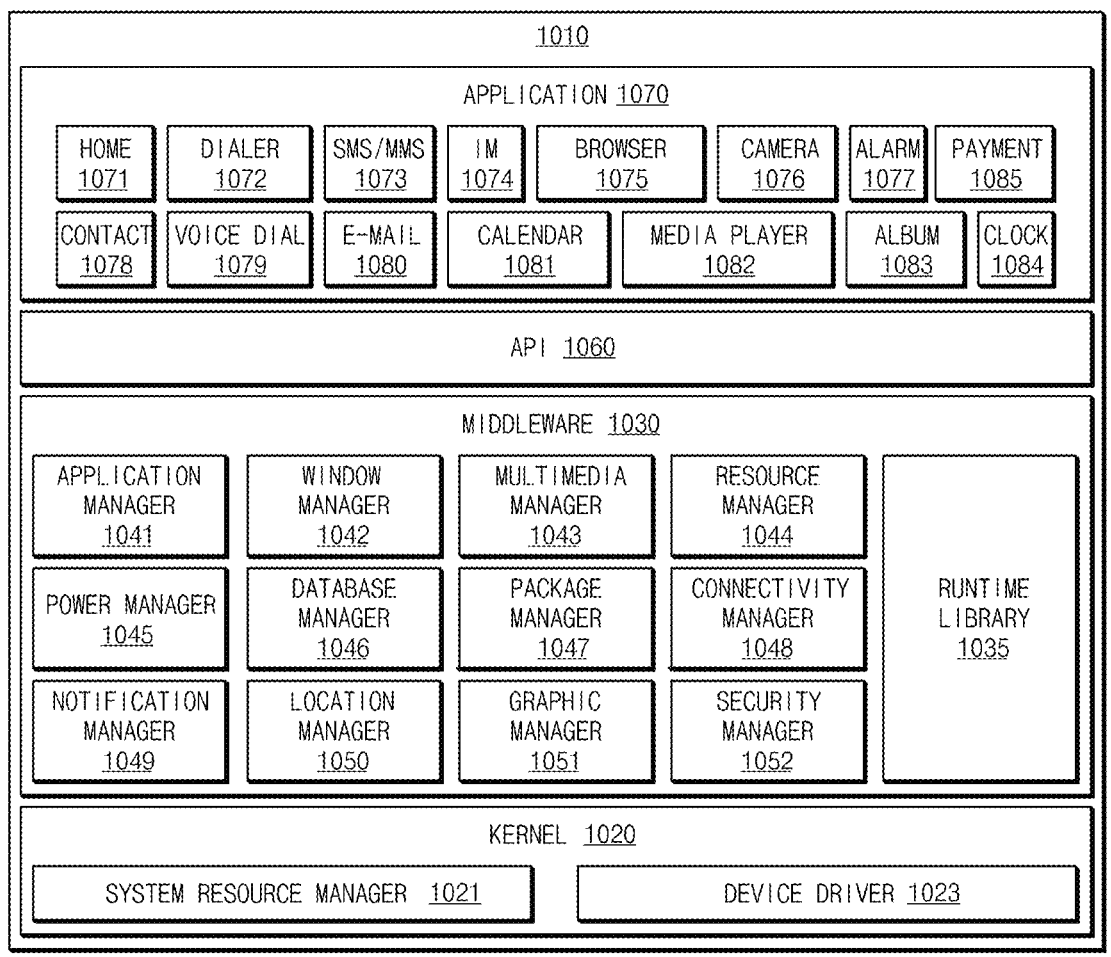
FIG. 10 illustrates a block diagram of a program module, according to certain embodiments of the present disclosure.

FIG. 10 illustrates a block diagram of a program module, according to certain embodiments of the present disclosure.

According to certain embodiments of the present disclosure, program module 1010 may include an operating system (OS) for controlling resources associated with an electronic device (e.g., an electronic device 901 of FIG. 9) and/or various applications which are executed on the operating system. The OS may be, for example, Android, iOS, Windows, Symbian, Tizen, or Bada, and the like.

The program module 1010 may include a kernel 1020, a middleware 1030, an application programming interface (API) 1060, and/or an application 1070. At least part of the program module 1010 may be preloaded on the electronic device, or may be downloaded from an external electronic device.

The kernel 1020 may include, for example, a system resource manager 1021 and/or a device driver 1023. The system resource manager 1021 may control, assign, or collect, and the like system resources. According to an embodiment of the present disclosure, the system resource manager 1021 may include a process management unit, a memory management unit, or a file system management unit, and the like. The device driver 1023 may include, for example, a display driver, a camera driver, a Bluetooth (BT) driver, a shared memory driver, a universal serial bus (USB) driver, a keypad driver, a wireless-fidelity (Wi-Fi) driver, an audio driver, or an inter-process communication (IPC) driver.

The middleware 1030 may provide, for example, functions the application 1070 needs in common, and may provide various functions to the application 1070 through the API 1060 such that the application 1070 efficiently uses limited system resources in the electronic device. According to an embodiment of the present disclosure, the middleware 1030 may include at least one of a runtime library 1035, an application manager 1041, a window manager 1042, a multimedia manager 1043, a resource manager 1044, a power manager 1045, a database manager 1046, a package manager 1047, a connectivity manager 1048, a notification manager 1049, a location manager 1050, a graphic manager 1051, a security manager 1052, or a payment manager 1054.

The runtime library 1035 may include, for example, a library module used by a compiler to add a new function through a programming language while the application 1070 is executed. The runtime library 1035 may perform a function about input and output management, memory management, or an arithmetic function.

The application manager 1041 may manage, for example, a life cycle of at least one of the application 1070. The window manager 1042 may manage graphic user interface (GUI) resources used on a screen of the electronic device. The multimedia manager 1043 may determine a format utilized for reproducing various media files and may encode or decode a media file using a codec corresponding to the corresponding format. The resource manager 1044 may manage source codes of at least one of the application 1070, and may manage resources of a memory or a storage space, and the like.

The power manager 1045 may act together with, for example, a basic input/output system (BIOS) and the like, may manage a battery or a power source, and may provide power information utilized for an operation of the electronic device. The database manager 1046 may generate, search, or change a database to be used in at least one of the application 1070. The package manager 1047 may manage installation or update of an application distributed by a type of a package file.

The connectivity manager 1048 may manage, for example, wireless connection such as Wi-Fi connection or BT connection, and the like. The notification manager 1049 may display or notify events, such as an arrival message, an appointment, and proximity notification, by a method which is not disturbed to the user. The location manager 1050 may manage location information of the electronic device. The graphic manager 1051 may manage a graphic effect to be provided to the user or a user interface (UI) related to the graphic effect. The security manager 1052 may provide all security functions utilized for system security or user authentication, and the like. According to an embodiment of the present disclosure, when the electronic device (e.g., an electronic device 901 of FIG. 9) has a phone function, the middleware 1030 may further include a telephony manager (not shown) for managing a voice or video communication function of the electronic device.

The middleware 1030 may include a middleware module which configures combinations of various functions of the above-described components. The middleware 1030 may provide a module which specializes according to kinds of OSs to provide a differentiated function. Also, the middleware 1030 may dynamically delete some of old components or may add new components.

The API 1060 may be, for example, a set of API programming functions, and may be provided with different components according to operating systems. For example, in case of Android or iOS, one API set may be provided according to platforms. In case of Tizen, two or more API sets may be provided according to platforms.

The application 1070 may include one or more of, for example, a home application 1071, a dialer application 1072, a short message service/multimedia message service (SMS/MMS) application 1073, an instant message (IM) application 1074, a browser application 1075, a camera application 1076, an alarm application 1077, a contact application 1078, a voice dial application 1079, an e-mail application 1080, a calendar application 1081, a media player application 1082, an album application 1083, a clock application 1084, a payment application 1085, a health care application (e.g., an application for measuring quantity of exercise or blood sugar, and the like), or an environment information application (e.g., an application for providing atmospheric pressure information, humidity information, or temperature information, and the like), and the like.

According to an embodiment of the present disclosure, the application 1070 may include an application (hereinafter, for better understanding and ease of description, referred to as "information exchange application") for exchanging information between the electronic device (e.g., the electronic device 901 of FIG. 9) and an external electronic device. The information exchange application may include, for example, a notification relay application for transmitting specific information to the external electronic device or a device management application for managing the external electronic device.

For example, the notification relay application may include a function of transmitting notification information, which is generated by other applications (e.g., the SMS/MMS application, the e-mail application, the health care application, or the environment information application, and the like) of the electronic device, to the external electronic device. Also, the notification relay application may receive, for example, notification information from the external electronic device, and may provide the received notification information to the user of the electronic device.

The device management application may manage (e.g., install, delete, or update), for example, at least one (e.g., a function of turning on/off the external electronic device itself (or partial components) or a function of adjusting brightness (or resolution) of a display) of functions of the external electronic device which communicates with the electronic device, an application which operates in the external electronic device, or a service (e.g., a call service or a message service) provided from the external electronic device.

According to an embodiment of the present disclosure, the application 1070 may include an application (e.g., the health card application of a mobile medical device) which is preset according to attributes of the external electronic device. According to an embodiment of the present disclosure, the application 1070 may include an application received from the external electronic device. According to an embodiment of the present disclosure, the application 1070 may include a preloaded application or a third party application which may be downloaded from a server. Names of the components of the program module 1010 according to various embodiments of the present disclosure may differ according to kinds of operating systems.

According to various embodiments of the present disclosure, at least part of the program module 1010 may be implemented with software, firmware, hardware, or at least two or more combinations thereof. At least part of the program module 1010 may be implemented (e.g., executed) by, for example, a processor (e.g., a processor 910). At least part of the program module 1010 may include, for example, a module, a program, a routine, sets of instructions, or a process, and the like for performing one or more functions.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor (e.g., the processor 910), the processor may perform functions corresponding to the instructions. The computer-readable storage medium may be, for example, the memory 930.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a display configured to receive a user input;
   at least one piezoelectric element disposed adjacent to the display and configured to vibrate based on a control signal;
   a memory configured to store information about the user input; and
   a processor configured to:
   receive the user input on the display, and
   control, with the control signal, the at least one piezoelectric element to vibrate to output at least one of a specified vibration or a specified sound through the display based on a device type selected for the user input, the output being defined by the information about the user input, wherein the control signal is generated based a location of the user input relative to the at least one piezoelectric element.

2. The electronic device of claim 1, wherein the processor is configured to:
   identify a type of a writing instrument object selected by a user on the electronic device with regard to the user input; and
   apply the control signal corresponding to the type of the writing instrument object to the at least one piezoelectric element.

3. The electronic device of claim 1, wherein the processor is configured to:
   if a pressure value associated with the user input is not less than a specified critical pressure value, increase amplitude of the control signal to be applied to the at least one piezoelectric element.

4. The electronic device of claim 1, wherein the at least one piezoelectric element includes a single piezoelectric element,
   wherein the processor is configured to:
   as a coordinate value associated with the location of the user input is spaced apart from the single piezoelectric element, increase amplitude of the control signal to be applied to the single piezoelectric element.

5. The electronic device of claim 1, wherein the at least one piezoelectric element includes a plurality of piezoelectric elements,
   wherein the processor is configured to:
   if coordinate values associated with the location of the user input are plural and the coordinate values continue from a first location to a second location on the electronic device, gradually decrease amplitude of the control signal to be applied to at least one first piezoelectric element adjacent to the first location and gradually increase the amplitude of the control signal to be applied to at least one second piezoelectric element adjacent to the second location.

6. The electronic device of claim 1, wherein the processor allows a signal of an audible frequency band associated with the output of at least one of the specified sound or the specified vibration to be output in the display depending on vibration of the display according to vibration of the at least one piezoelectric element.

7. A feedback outputting method of an electronic device including at least one piezoelectric element, the method comprising:
   receiving a user input on a display; and
   controlling, with a control signal, the at least one piezoelectric element to vibrate to output at least one of a specified vibration or a specified sound through the display based on a device type selected for the user input, the output being defined by information of the user input, wherein the control signal is generated based a location of the user input relative to the at least one piezoelectric element.

8. The method of claim 7, wherein receiving of the user input includes:
   identifying a type of a writing instrument object selected from a user on the electronic device with regard to the user input.

9. The method of claim 8, wherein controlling the at least one piezoelectric element includes:
   applying the control signal corresponding to the type of the writing instrument object to the at least one piezoelectric element.

10. The method of claim 7, wherein receiving the user input includes:
    obtaining pressure information about the user input.

11. The method of claim 10, wherein controlling the at least one piezoelectric element includes:
    if a pressure value associated with the user input is not less than a specified critical pressure value, increasing amplitude of the control signal to be applied to the at least one piezoelectric element.

12. The method of claim 7, wherein receiving the user input includes:
    obtaining coordinate information about the user input.

13. The method of claim 12, wherein controlling the at least one piezoelectric element includes:
    as a coordinate value associated with the location of the user input is spaced apart from the at least one piezoelectric element, increasing amplitude of the control signal to be applied to the at least one piezoelectric element.

14. The method of claim 12, wherein controlling the at least one piezoelectric element includes:
    if coordinate values associated with the location of the user input are plural and the coordinate values continue from a first location to a second location on the electronic device, gradually decreasing amplitude of the control signal to be applied to at least one first piezoelectric element adjacent to the first location.

15. The method of claim 12, wherein controlling the at least one piezoelectric element includes:
    if coordinate values associated with the user input are plural and the coordinate values continue from a first location to a second location on the electronic device, gradually increasing amplitude of the control signal to be applied to at least one second piezoelectric element adjacent to the second location.

16. An electronic device comprising:
    a display configured to receive a user input;
    at least one piezoelectric element configured to vibrate in response to a specified control signal; and
    a processor configured to control, with a control signal, the at least one piezoelectric element to output at least one of a specified vibration or a specified sound through the display based on a device type selected for the user input, wherein the output is defined by information of the user input, wherein the control signal is generated based a location of the user input relative to the at least one piezoelectric element.

17. The electronic device of claim 16, wherein the processor is configured to:
    identify the device type of the user input as a type of a writing instrument object selected by a user on the electronic device with regard to the user input; and
    apply the control signal corresponding to the type of the writing instrument object to the at least one piezoelectric element.

18. The electronic device of claim 16, wherein the processor is configured to:
    if a pressure value associated with the user input is not less than a specified critical pressure value, increase amplitude of the control signal to be applied to the at least one piezoelectric element.

19. The electronic device of claim 16, wherein the at least one piezoelectric element includes a single piezoelectric element,
    wherein the processor is configured to:
    as a coordinate value associated with the location of the user input is spaced apart from the single piezoelectric element, increase amplitude of the control signal to be applied to the single piezoelectric element.

20. The electronic device of claim 16, wherein the at least one piezoelectric element includes a plurality of piezoelectric elements,
    wherein the processor is configured to:
    if coordinate values associated with the user input are plural and the coordinate values continue from a first location to a second location on the electronic device, gradually decrease amplitude of the control signal to be applied to at least one first piezoelectric element adjacent to the first location and gradually increase the amplitude of the control signal to be applied to at least one second piezoelectric element adjacent to the second location.

* * * * *